(12) United States Patent
Ham, III

(10) Patent No.: US 7,409,028 B2
(45) Date of Patent: Aug. 5, 2008

(54) CLOCK SYNCHRONIZATION IN A COMMUNICATIONS ENVIRONMENT

(75) Inventor: Eugene D. Ham, III, Morrisville, NC (US)

(73) Assignee: Ericsson Inc., Research Triangle Park, NC (US)

( * ) Notice: Subject to any disclaimer, the term of this patent is extended or adjusted under 35 U.S.C. 154(b) by 1683 days.

(21) Appl. No.: 09/747,052

(22) Filed: Dec. 22, 2000

(65) Prior Publication Data

US 2002/0080901 A1   Jun. 27, 2002

(51) Int. Cl.
H03D 3/24      (2006.01)

(52) U.S. Cl. .................. 375/376; 375/373; 375/327; 375/294; 375/215

(58) Field of Classification Search .......... 375/376, 375/324, 329, 371, 355, 327, 373, 374, 354, 375/215, 294; 331/17, 2, 10, 11, 1 A; 327/156
See application file for complete search history.

(56) References Cited

U.S. PATENT DOCUMENTS

| | | | | |
|---|---|---|---|---|
| 4,272,729 A * | 6/1981 | Riley, Jr. .................. | 331/1 A |
| 4,931,748 A * | 6/1990 | McDermott et al. ......... | 331/1 A |
| 5,166,634 A * | 11/1992 | Narahashi et al. ........... | 330/151 |
| 5,521,532 A * | 5/1996 | Gumm ....................... | 327/105 |
| 5,619,543 A * | 4/1997 | Glass ........................ | 375/376 |
| 5,659,586 A | 8/1997 | Chun | |
| 5,691,668 A * | 11/1997 | Yoshikawa et al. .......... | 330/151 |
| 5,697,055 A * | 12/1997 | Gilhousen et al. ........... | 455/436 |
| 5,815,036 A * | 9/1998 | Yoshikawa et al. ........... | 330/52 |
| 5,881,110 A * | 3/1999 | Cochran ..................... | 375/324 |
| 5,909,148 A * | 6/1999 | Tanaka ........................ | 331/2 |
| 6,043,810 A * | 3/2000 | Kim et al. .................... | 345/173 |
| 6,100,765 A | 8/2000 | Pax et al. | |
| 6,281,935 B1 * | 8/2001 | Twitchell et al. ............ | 348/470 |
| 6,353,647 B1 * | 3/2002 | Wilhelmsson et al. ....... | 375/376 |
| 6,356,158 B1 * | 3/2002 | Lesea .......................... | 331/11 |

FOREIGN PATENT DOCUMENTS

EP      0590323 A1    4/1994
WO      WO 98/23071   5/1998

OTHER PUBLICATIONS

Serizawa, Mutsumu; Suzuki, Hideo; "An Adaptive Carrier Tracking Loop for Digital Satellite Mobile Communications," IEEE, 1987, pp. 1754-1760.

* cited by examiner

Primary Examiner—Ted Wang
Assistant Examiner—Stephen Chin
(74) Attorney, Agent, or Firm—Coats & Bennett, P.L.L.C.

(57) ABSTRACT

A method and system provide a stable reference clock for use in a communication system. A phase-locked loop (PLL) receives an input clock signal with potentially unacceptable levels of jitter and wander. The PLL provides a synchronized output clock with significantly reduced jitter and wander. The PLL nominally uses a digital-to-analog converter (DAC) to control a voltage-controlled oscillator (VCO). Applying a loop filter function to the phase difference between the input clock and the output clock generates control values for the DAC. Loop filter adaptation is based on control value averages, which enhances stability and frequency locking performance. Frequency lock detection is based on the consistency of the DAC control values, rather than on a predetermined target value, making the PLL a self-calibrating system. The long-term average of the control value in the locked state may be stored for later use as an initial DAC setting.

39 Claims, 16 Drawing Sheets

CLOCK SYNCHRONIZATION IN A COMMUNICATIONS ENVIRONMENT

BACKGROUND OF THE INVENTION

The present invention relates generally to communication systems, and, more particularly, to generating a stable reference clock for carrier frequency generation in such systems.

Communication systems, such as wireless communication networks, typically comprise disparate pieces of interconnected communications equipment to provide overall system functionality. Coordination and synchronization of the different communication system elements is an important and challenging aspect with regard to the design of the overall communication system.

Oftentimes, communication systems are arranged in a hierarchical fashion, with a master component providing overall synchronization and control for subordinate elements within the system. For example, in a wireless communication network, a mobile switching center (MSC) is often used to interface one or more base stations with various other networks, such as the Public Switched Telephone Network (PSTN). T1/E1 communication links, based on pulse code modulation (PCM), allow signaling and control between the various elements in a wireless communication network. Additionally, the T1/E1 data clock serves as a common time base for various elements in the system, and thus can be used to maintain overall system synchronization.

At least one timing-based function within the typical wireless communication network is subject to particularly stringent accuracy requirements. This function involves generation of the transmit carrier frequencies that are used in the transmit signals broadcast within the wireless communication network service area. The Federal Communications Commission (FCC) mandates strict limits for carrier frequency generation error to minimize interference. While the T1/E1 specification defines a relatively accurate and stable data clock, the specification permits maximum allowable errors for certain types of clock deviations that are in excess of the maximum errors permissible if the T1/E1 clock is used as a reference for carrier frequency generation.

BRIEF SUMMARY OF THE INVENTION

The present invention comprises a method and system for reducing clock deviations, such as jitter and wander, in a timing reference signal. A phase-locked loop (PLL) module generates an output clock synchronized to the timing reference signal, but with significantly reduced clock deviations. With low jitter and wander, the output clock is suitable as a carrier reference frequency in radio transceiver equipment. The PLL module generates a phase error signal based on a detected phase difference between the output clock and the timing reference. Filtering the phase error signal produces a control output value. Based on processing these control output values, the PLL determines how the PLL loop filter should be adapted to improve frequency-locking time, or to maintain the clock output in a stable, locked condition. Filter characteristics are set according to operating state, which is in turn determined by processing the control output values.

The control output values determine the value or magnitude of an oscillator control signal that determines the frequency and stability of the output clock generated by a controllable oscillator within the PLL module. Thus, stable and consistent output control values translate into a stable and consistent output clock. The PLL module operates with relatively heavy filtering on the control output values in the locked state, and relatively less filtering when not in the locked state. The least filtering is used in a coarse state of operation, activated when the PLL module is achieving lock for the first time. Filter settings and state transitions are based on processing averaged control output values. The processing and state transition techniques used capitalize on the stability advantages imparted by using averaged values without sacrificing responsive locking performance.

For a given PLL module configuration, the control value output values will tend towards a constant value that minimizes phase error between the timing reference signal and the clock output signal. This constant value is determined by the divisor ratio between the input timing reference signal and the output clock signal, and by characteristics and tolerances of the circuit elements comprising the PLL module. For a given frequency of the input timing signal and a given PLL module configuration, the constant value may be predicted and stored for use as an initial point for setting the control output value. However, with the ability to determine an actual long-term average control output value in the locked condition, the PLL module can update the startup value with a more accurate control value to use as an initial reference. This avoids reliance on a fixed, absolute value as a reference to evaluate the control output value during PLL operation, making the PLL module a "self-calibrating" system.

In a typical configuration, the PLL module comprises a counter-based phase detector (PD) providing a digital phase error signal to a proportional-integral (P-I) digital filter. The control output value is taken as the P-I filter output and provided to a digital-to-analog controller (DAC), which provides a voltage-mode output signal responsive to the control output values as the oscillator control signal. A voltage-controlled oscillator (VCO) operates under control of the DAC output signal. The DAC input values provided by the P-I filter are averaged and processed to detect whether the PLL module is locked, and to determine whether the PLL module operating state should be changed, which results in changing the P-I filter coefficients.

DETAILED DESCRIPTION OF THE INVENTION

The present invention is directed to improving the signal integrity of a PLL-based timing signal that is synchronized with a communication network timing reference signal. The operation of radio transceiver equipment and corresponding control interface equipment is typically synchronized using a common time base. The communication link between the radio transceiver and control interface equipment may provide a common timing reference. The T1/E1 frame and slot timing standards are examples of this. T1/E1 communication links provide an opportunity to synchronize various pieces of equipment within a wireless communication network. However, under some circumstances, the clock signal recovered from the T1/E1 communication links has excessive levels of clock deviation, such as jitter and wander. These deviations render the clock signal unsuitable for direct use in carrier frequency generation.

Figure 1:
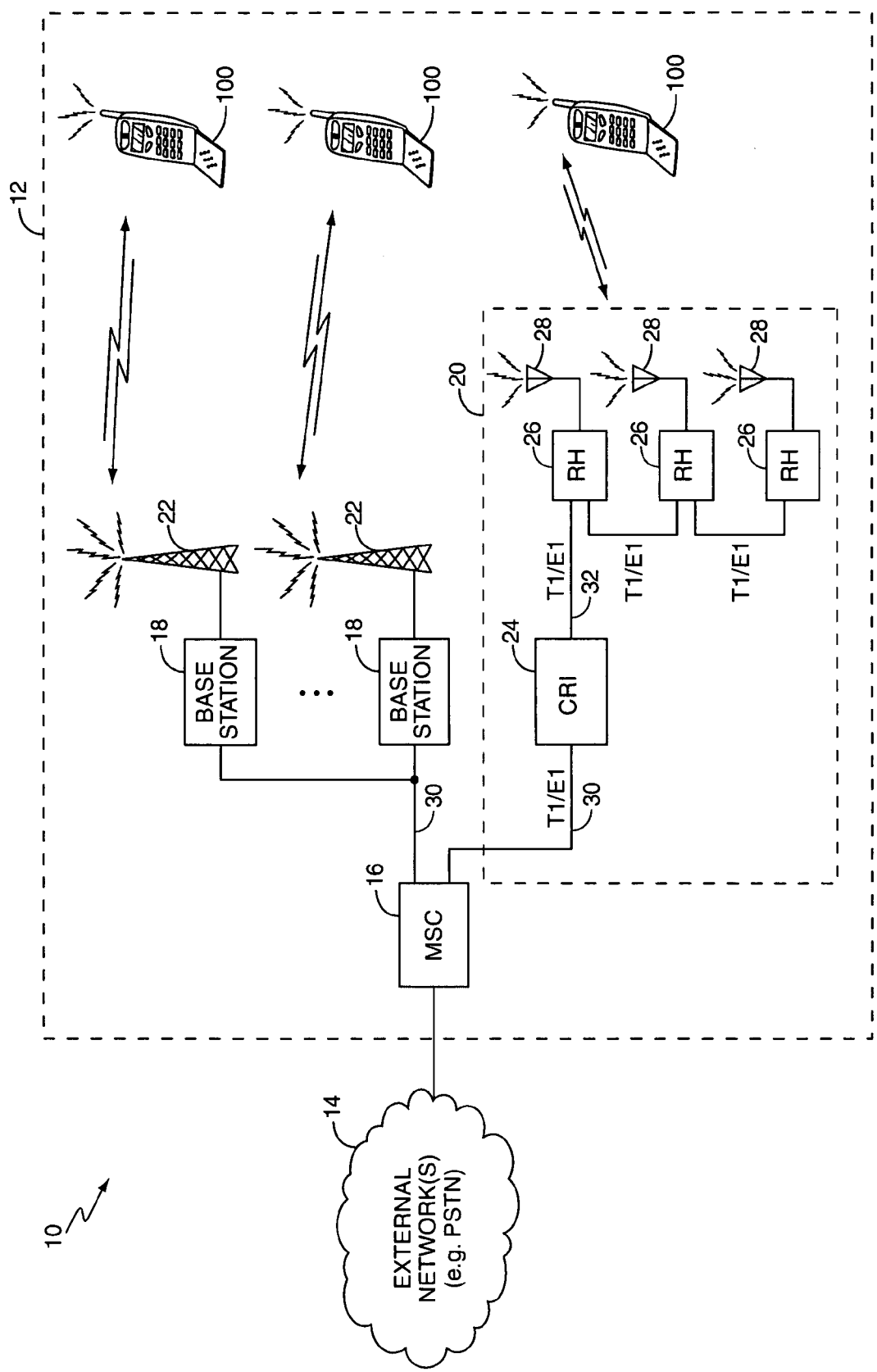
FIG. 1 is a diagram of a wireless communication system in which the present invention may be advantageously used.

Referring now to FIG. 1, a communication system 10 includes a wireless communication network 12 interfaced with one or more external networks 14. The external networks 14 may include, the public switched telephone network (PSTN), integrated services digital networks (ISDN), the Internet, or any combination thereof. The wireless communication network 12 comprises a mobile switching center (MSC) 16, which interfaces with a number of base stations 18 and a local wireless telephone system (LWTS) 20, and the external networks 14. RF signaling between one or more mobile terminals 100 and the base stations 18 or LWTS 20 allow users of the mobile terminals 100 to communicate with other mobile terminal users and with the associated external networks 14. Each base station 18 is typically associated with at least one receive/transmit antenna 22 supporting RF communications with the various mobile terminals 100.

Generally, the wireless communication network 12 is arranged such that the base stations 18 are geographically distributed to provide wireless communication services to a defined region, otherwise known as a cell. Only one MSC 16 and a small number of base stations 18 are illustrated for clarity, but a practical wireless communication network 12 may comprise multiple MSCs 16 and an even greater number of base stations 18 to extend wireless communication service coverage to a large number of cells. In certain circumstances, perhaps arising from an inability to secure sufficient service coverage through an existing base station arrangement, use of the LWTS 20 can be advantageous for the wireless communication network 12.

The LWTS 20 comprises a control radio interface (CRI) 24 interfacing the MSC 16 to one or more radio heads (RH) 26. While three radio heads 26 are shown connected with the CRI 24, practical implementations provide support for fewer or more radio heads 26 as particular needs dictate. Indeed, the MSC 16 may interface with multiple CRIs 24, with each CRI 24 supporting one or more radio heads 26 and associated antennas 28.

The radio heads 26 are, as compared to the base stations 18, generally smaller, lower-power communication transceivers that allow wireless communication service providers to extend coverage into areas unreachable by normal service equipment, or to provide localized cellular coverage for a specific purpose. For example, one or more radio heads 26 may be mounted inside a shopping mall complex or other public structure frequented by many people, but with otherwise poor wireless communication coverage.

Communications between the MSC 16, the various base stations 18, and the CRI 24 include control and data signaling. Because it is necessary for the overall wireless communication network 12 to remain synchronized, the communication links 30 between the MSC 16 and the base stations 18 and CRI 24 are used to synchronize communications and control operations within the base stations 18 and CRI 24 to timing in the MSC 16. In turn, the CRI 24 sends data and control information via a communication link 32 to the various radio heads 26 it supports. The CRI 24 may either pass a timing signal from the MSC 16 to the radio heads 26, or regenerate an MSC timing signal for use by the radio heads 26. In a typical implementation, communications between the MSC 16, the base stations 18, and the CRI 24 is based on T1/E1 standards.

T1/E1 communications are based on time division multiplexing (TDM), wherein separate communications signals or data are time multiplexed by defining a repeating window or frame in time with a separate slot in each frame allocated to each communications signal. T1 operates at 1.544 megabits per second, while E1 provides 2.048 megabits per second. Data is encoded using pulse code modulation (PCM) in T1/E1 communications. Communications between the CRI 24 and the radio heads 26, whether representing traffic from the MSC 16 to the CRI 24 or information from the mobile terminal 100 to the CRI 24, may be carried on the T1/E1 communication link 32.

Thus, if the communication link 32 from the CRI to the radio heads is synchronized with the T1/E1 communication link 30 from the MSC 16 to the CRI 24, the radio heads 26 can operate in synchronization with the MSC 16. Similarly, various operations of each base station 18 may be synchronized to the MSC 16 using the T1/E1 communication link 30 from the MSC 16 to the base stations 18.

While the T1/E1 communication link 32 from the CRI 24 to the radio heads 26 provides the radio heads 26 with a synchronous timing signal, the T1/E1 specifications permit basic clock jitter and wander levels that exceed allowable limits for carrier frequency generation in the radio heads 26 and base stations 18. In the wireless communication system 12, carrier signals must be accurately generated to avoid interference, maintain quality of service, and support the greatest number of simultaneous users. The Federal Communications Commission (FCC) has promulgated strict controls governing the accuracy and stability of transmit carrier frequencies.

Figure 2:
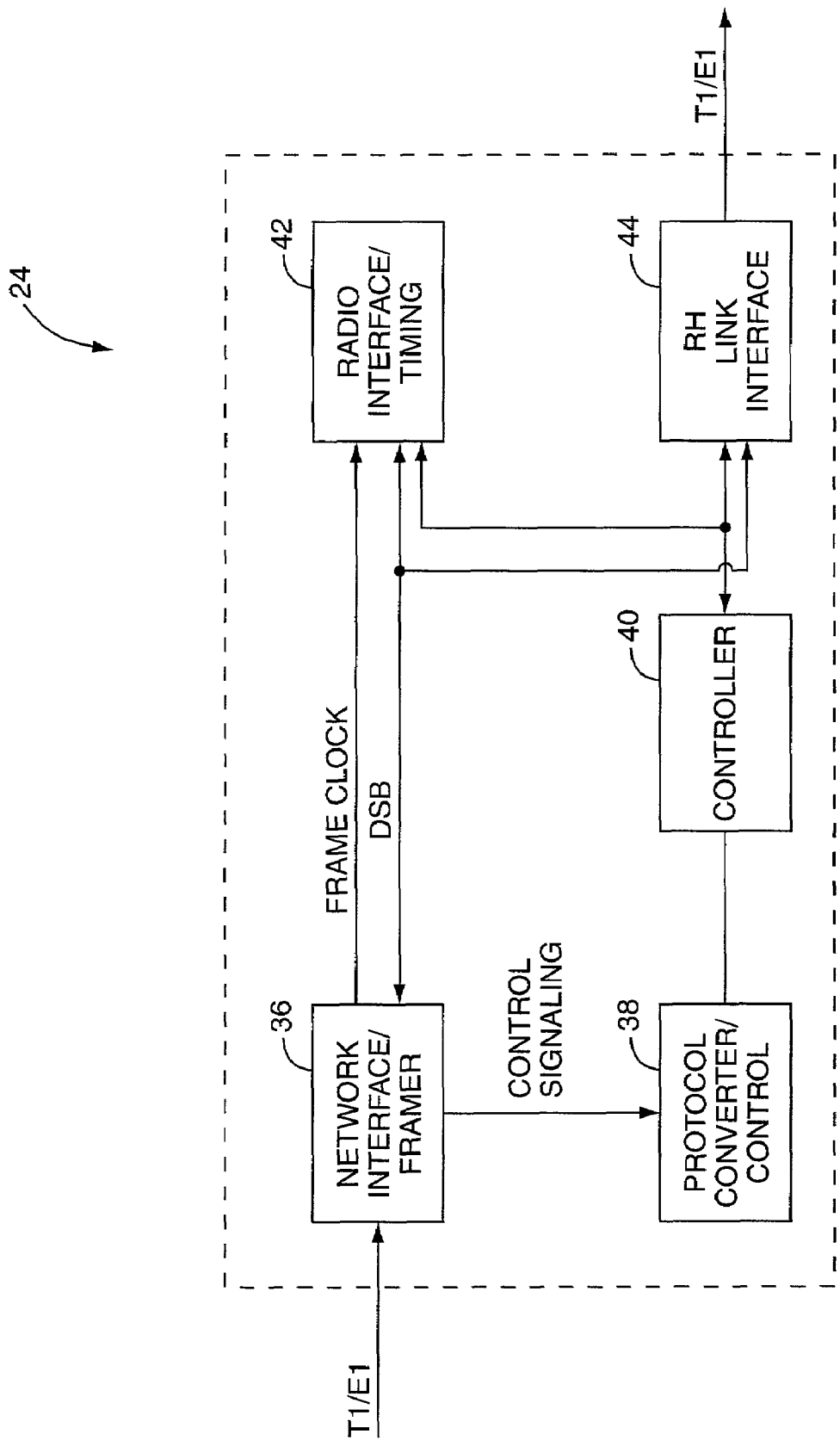
FIG. 2 is a diagram of the Control Radio Interface (CRI) shown in FIG. 1.

FIG. 2 is a simplified functional diagram of the CRI 24. A network interface/framer 36 receives a T1/E1 signal from the MSC 16. The T1/E1 signal contains both data and control signaling for the CRI 24. The network interface/framer 36 extracts the control information and provides it to a protocol converter/control function 38 that provides MSC control information to a controller 40, which allows the controller 40 to operate in accordance with command and control information from the MSC 16. The network interface/framer 36 provides a frame clock recovered from the communication link 30 to a radio interface timing function 42 and extracts data (e.g., speech) information from the T1/E1 communication link 30.

Speech information is distributed to the radio interface timing function 42 and a radio head link interface 44 via a device speech bus (DSB). The controller 40 controls operation of the radio interface timing function 42 and the radio head link interface 44 via a device control bus (DCB). The radio head link interface 44 generates a T1/E1 communication signal for the communication link 32, with the required control and speech information and provides this to the connected radio heads 26.

Figure 3:
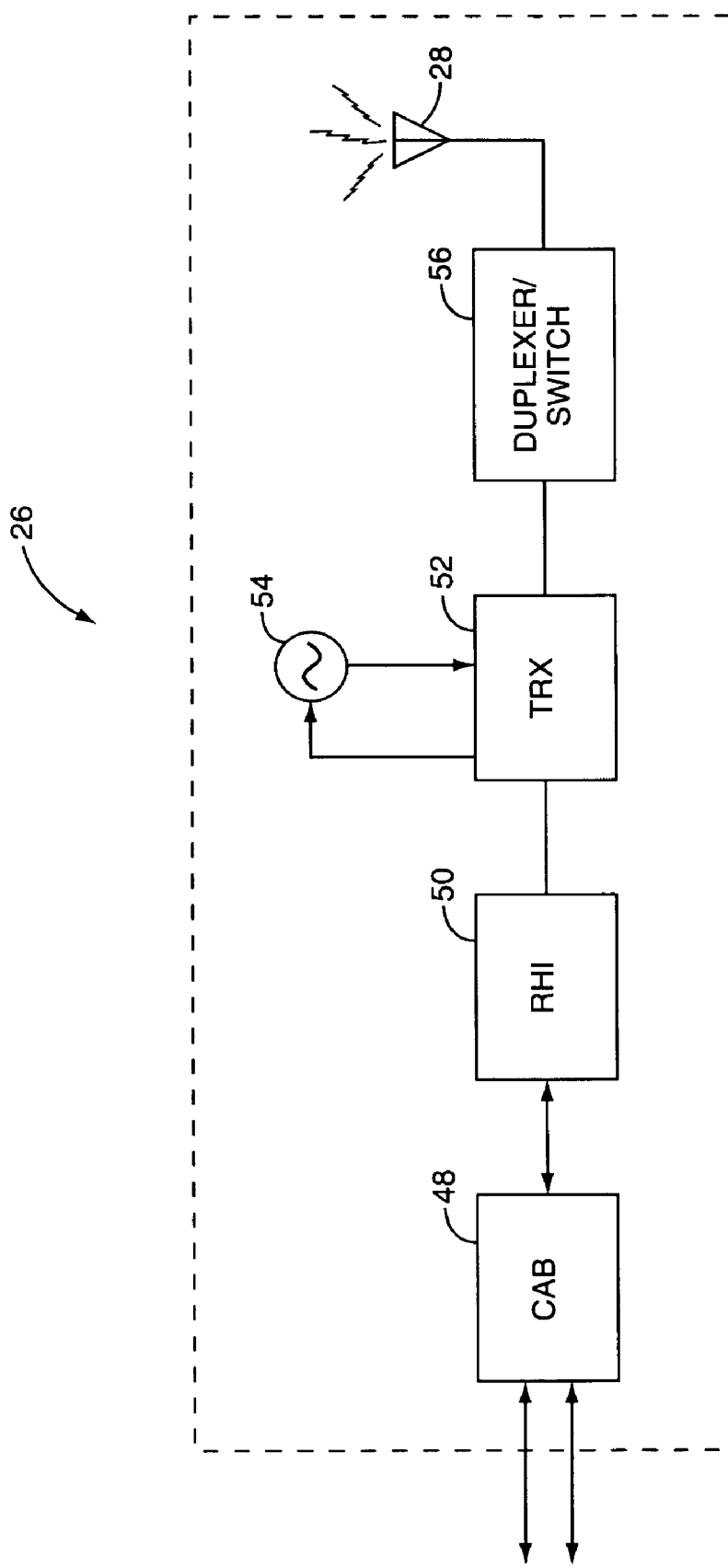
FIG. 3 is a diagram of a Radio Head (RH) shown in FIG. 1.

FIG. 3 is a simplified functional diagram of the radio head 26. The radio head 26 receives the T1/E1 communication link 32 from the CRI 24, which passes into a cascade attachment board (CAB) 48. The CAB 48 allows the radio head 26 to provide the CRI T1/E1 communication link 32 to subsequent radio heads 26 in daisy chain fashion. The T1/E1 communication link 32 passes through the CAB 48 to a radio head interface (RHI) 50. The RHI 50 provides control, data, and timing information to a radio transceiver (TRX) 52.

Operating in cooperation with a frequency synthesizer 54, the radio transceiver 52 generates transmit signals at assigned carrier frequencies to support communications with the mobile terminals 100. Transmit signals pass through the duplexer/switch 56 and are transmitted by the associated antenna 28. The same antenna 28 receives radio transmissions from the mobile terminals 100. These received signals pass through the duplexer/switch 56, which routes them to the transceiver 52. The transceiver 52 downconverts the received signals, demodulates them, and extracts the embedded information. Extracted information passes to the RHI 50 for transfer to the CRI 24.

Figure 4:
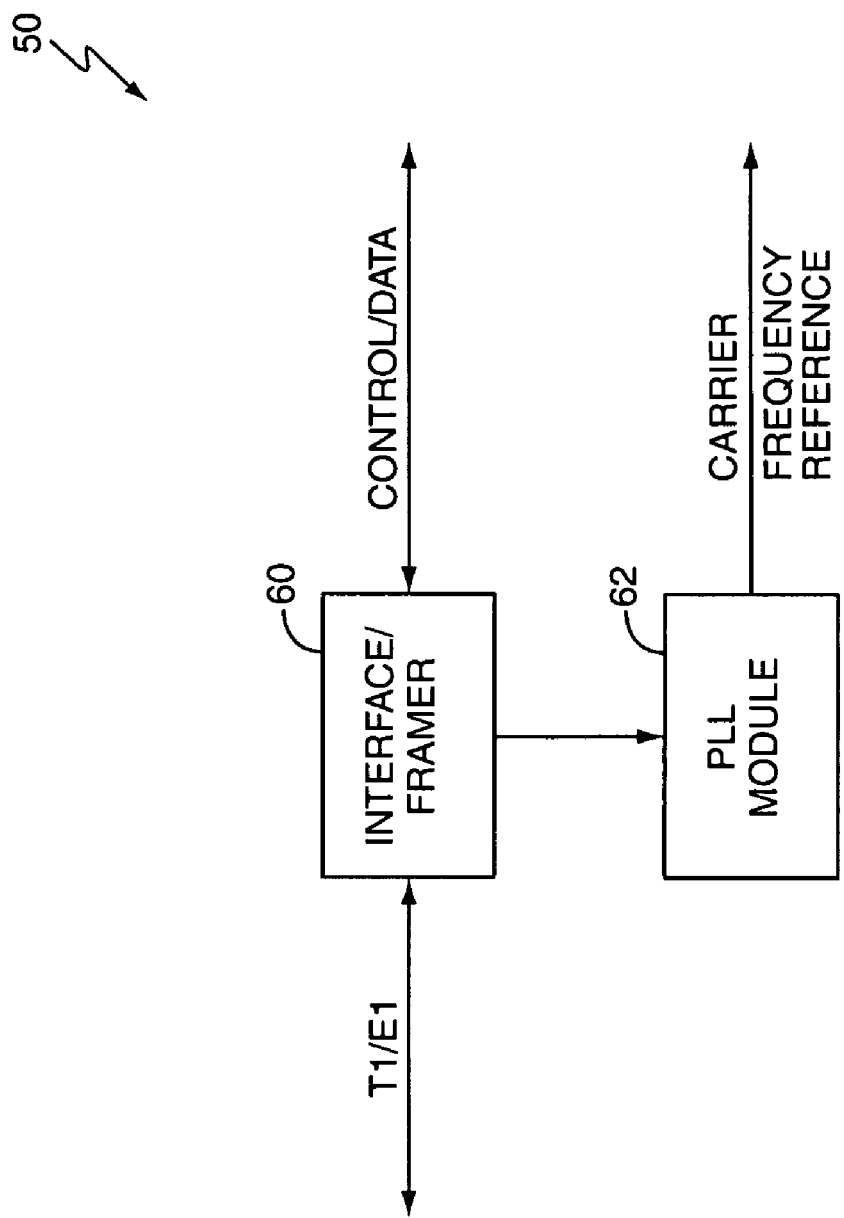
FIG. 4 is a diagram of the Radio Head Interface (RHI) shown in FIG. 3.

FIG. 4 is a simplified functional diagram of the RHI 50. The interface/framer 60 receives signals on the T1/E1 communication link 32 from the CAB 48 and passes control and data information to the radio transceiver 52. The interface/framer 60 provides a recovered T1/E1 clock to a PLL module 62. The PLL module 62 generates a clock output signal suitable for use as a carrier frequency reference. More particularly, the PLL module 62 operates on the recovered T1/E1 clock to greatly reduce any jitter and wander present in the recovered clock signal.

Figure 5:
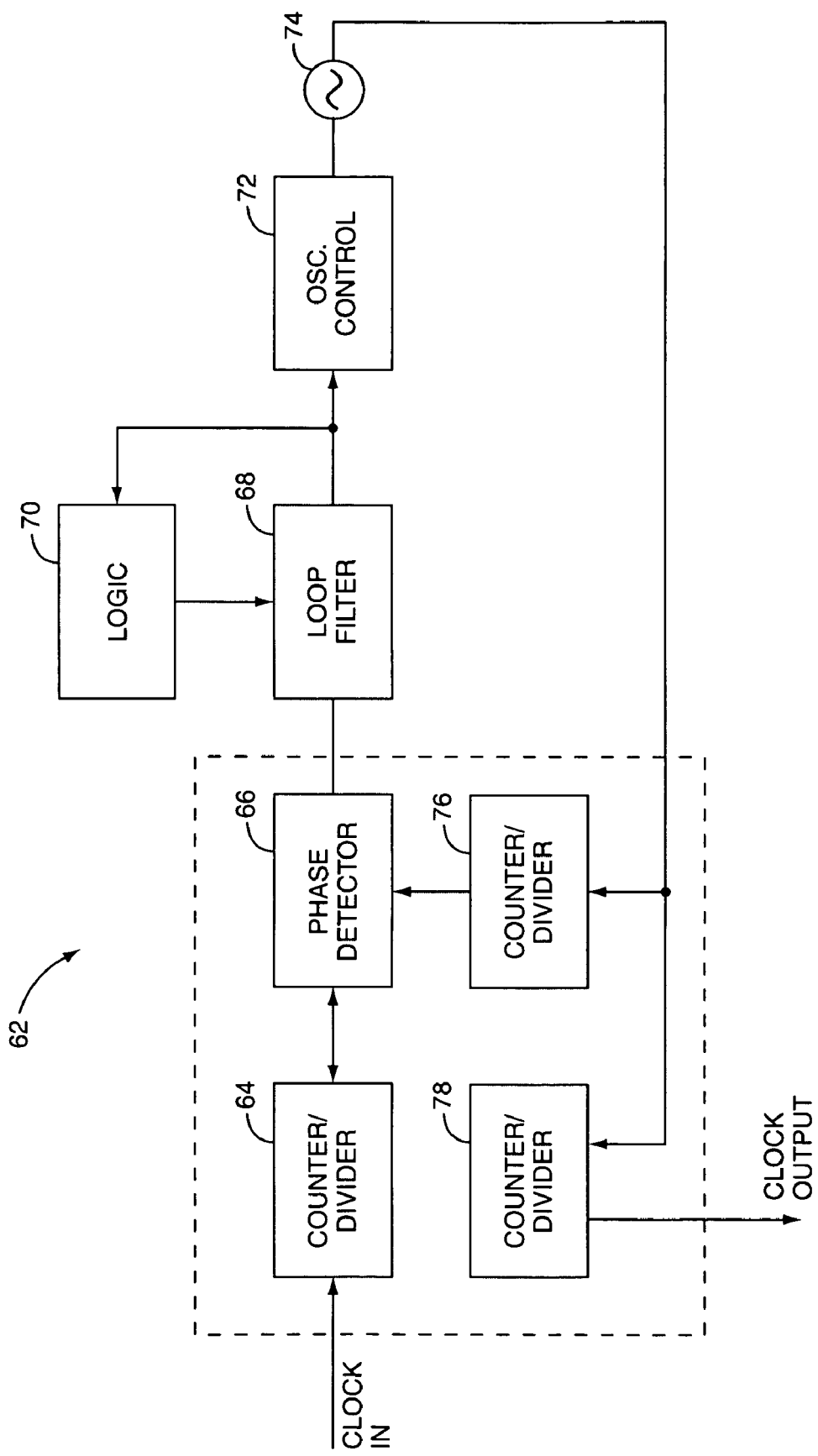
FIG. 5 is a diagram of a PLL module in accordance with the present invention and used in the RHI of FIG. 4.

FIG. 5 illustrates the PLL module 62. The PLL module 62 comprises an input signal counter/divider 64, a phase detector 66, a loop filter 68 and associated processing logic 70, an oscillator controller 72, an oscillator 74, a feedback counter/divider 76, and an output clock generator 78.

In general, the input counter/divider 64 provides a reference signal driven by the T1/E1 clock signal recovered from the CRI communication link 32 to the phase detector 66. The phase detector 66 additionally receives a feedback signal driven by the output clock signal produced by the PLL module 62, and generates a phase error signal by determining a phase difference between the reference signal and the feedback signal. The loop filter 68 operates on the phase error signal to generate a control value. In turn, the control value determines the value or magnitude of the oscillator control signal generated by the oscillator controller 72. The oscillator 74 generates the output clock at a frequency determined by the oscillator control signal.

Control logic 70 operates on the loop filter output—the control values—to determine when and how to update the loop filter 68. Updating the loop filter 68 allows the control logic 70 to adjust the filtering performed on the phase error signal, and thus change the overall response of the PLL module 62. By operating on the output of the loop filter 68, the control logic 70 bases loop filter adaptations on filtered control values, rather than on the pre-filtered phase error signal, which may have relatively high frequency deviations present.

In an exemplary embodiment of the PLL module 62, the input counter/divider 64 counts clock cycles in the clock signal recovered from the incoming T1/E1 communication link 32. Upon reaching a configured count limit, the input counter/divider 64 generates an overflow or "count expired" signal. The PLL module 62 may be configured to generate the count expired signal at fixed intervals, such as every 250 ms. Thus, the count expired signal may be generated as a low-frequency clock (e.g., 4 Hz), depending upon the configured count value of the input counter/divider 64. The PLL module 62 may be configured to recognize whether a 1.544 MHz (T1) or 2.048 MHz (E1) clock signal is being used, so that the count expired signal is consistently generated.

Because of the need to detect relatively small phase differences, using a relatively high frequency output clock is desirable. Assuming a nominal output frequency of 24.576 MHz for the oscillator, the feedback counter/divider 76 may be configured to count through a fixed number of counter cycles per every count expired signal interval. For example, if the feedback counter/divider 76 is clocked at 24.576 MHz, it receives 6,144,000 clocks every 250 ms—the length of one count expired cycle. By configuring the rollover count value of the feedback counter/divider 76 such that it is an integer multiple of 6,144,000, the current count value the feedback counter/divider 76 should be consistent with respect to the count expired signal. Thus, at the end of every 250 ms as timed by the input counter/divider 64 driven by the recovered T1/E1 clock, the count value in the feedback/counter divider 76 should be the same.

As an example, assume that the feedback counter/divider 76 is configured to count up to a maximum value of 8191 from 0, and then rollover. The value 6,144,000/8192 =750, thus the feedback counter/divider 76 counts through its maximum value 750 times for every one count expired cycle. With this type of configuration, the phase detector 66 need only be some type of digital latch adapted to capture the "current count" in the feedback counter/divider 76 in response to the count expired signal from the input counter/divider 64. The phase detector 66 (or control logic 70) can then determine the difference between an "ideal" capture count and the current capture count. Rather than using an ideal capture count, the first capture count may be used as a reference and updated as needed.

If the oscillator output frequency is drifting or otherwise deviating from the desired value, the current count value will vary from between successive count expired clock cycles. If the oscillator frequency is above the desired value, the feedback counter/divider runs faster and the current count increases by a proportionate amount over successive count expired cycles. Conversely, if the oscillator output frequency is lower than the desired value, the current count decreases by a proportionate amount over successive count expired cycles.

With the output from the phase detector 66 being a count difference value, denoted as PD for phase difference, the loop filter 68 is configured as a digital filter. A proportional-integral (P-I) filter configuration provides suitable filter performance with reasonable constraints on filter complexity. One configuration for the loop filter 68 is as follows, $$\text{Filter Output} = K_p * PD + K_i * IPD.$$

Where $K_p$ is the proportional filter coefficient and $K_i$ is the integral filter coefficient, PD is the capture count difference explained above, and IPD is the integral of the capture count difference.

The loop filter output is a digital count value, termed the "control value," determined by the values of PD and IPD, as well as by the coefficient values $K_p$ and $K_i$. The control value may be used to set, for example, a digital-to-analog converter (DAC), operating as the oscillator control 72. As such, the DAC 72 might be a voltage-mode device generating an analog control signal (voltage) proportional to the control values received from the loop filter 68, and the oscillator 74 might be a voltage-controlled oscillator (VCO) generating an output signal at a clock frequency responsive to the control signal. Thus, the loop filter 68 generates digital control values that set the output voltage of a DAC (i.e., the oscillator controller 72), which in turn controls the oscillation frequency of the VCO 74.

A general technique for substantially eliminating clock deviations in the output signal provided by the PLL module 62 involves basing loop filter adaptations on the average control values. Averaging imparts an intrinsic smoothing function to the loop filter control, while several techniques for processing the control value averages permits good PLL module response. Many opportunities exist for defining and controlling state operation of the PLL module 62, with following discussion detailing one implementation that is advantageous for use in base stations 18 or radio heads 26 in providing a well-controlled carrier reference frequency to radio transceivers.

A restriction of ±0.08 PPM (parts per million) represents a typical accuracy requirement for carrier frequency generation. At a carrier frequency of 1900 MHz, a typical wireless communications transmission frequency, this restriction translates into an allowable frequency deviation of ±152 Hz from the 1900 MHz target. In looking at potential clock jitter in T1/E1 recovered clock, controlling specifications permit maximum jitter of 138 UI, where UI means "unit interval" and is referenced to the clock cycle timing of the signal of interest. For example, a 1.544 MHz T1 signal has a UI of 1/1.544 MHz, or 647.77 ns.

The resolution at which the control value may be set or adjusted dictates the tuning resolution of the overall system, which, in the radio head 26, includes the PLL module 62 and the radio transceiver 52 and associated frequency synthesizer 54. Assuming the VCO 74 has an output frequency of 24.576 MHz as earlier introduced, the ±0.08 PPM frequency accuracy translates into an allowable VCO frequency error of ±1.966 Hz (24.576 * 0.08). The VCO 74 is controlled by the DAC 72, which, in turn, is set by the filtered phase deviation (PD). Thus, the resolution of the DAC 72 and the PD count together determine how accurately the VCO 74 can be controlled. Assuming a 12-bit DAC (i.e., 4096 levels) at 1 mV per DAC count, each DAC count is 0.00586 PPM (24.576/4096).

This translates into 0.144 Hz per DAC count (24.5476 * 0.00586). Thus, the ±1.966 Hz VCO frequency requirement translates into ±13 DAC counts (control value counts). With each PD count equating to a frequency error of 4 Hz, the PD value provided to the loop filter 68 represents a coarse error signal with respect to the required control accuracy and represents a chief need for basing control on the filtered control values output by the loop filter 68.

Figure 6:
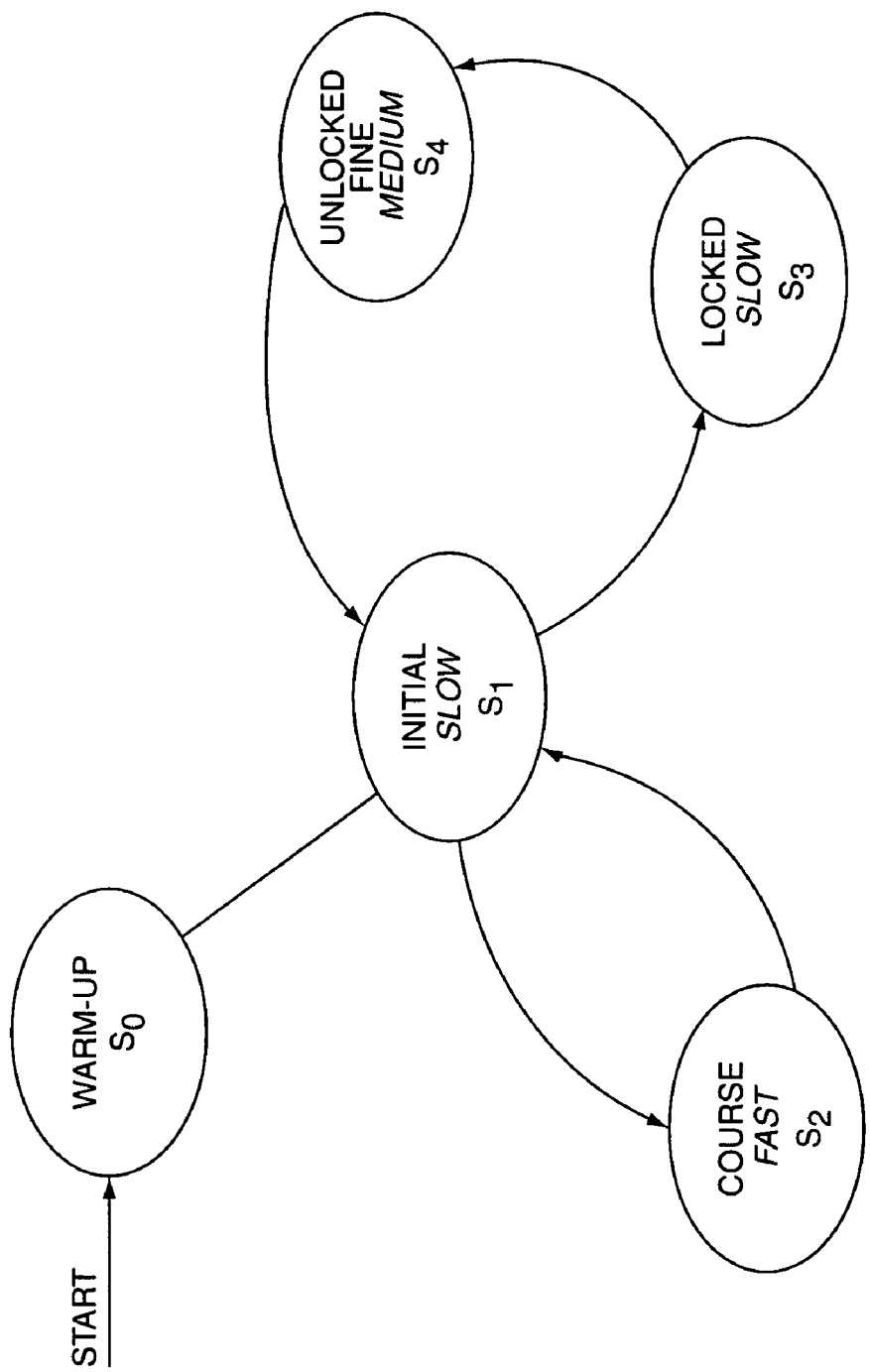
FIG. 6 is a PLL operating state diagram.

FIG. 6 illustrates an example state diagram for operating the PLL module 62. Exemplary operation includes five states: S0, STARTUP; S1, INITIAL; S2, COARSE; S3, LOCKED; and S4, UNLOCKED FINE. The overriding goal of state control is to quickly achieve and reliably maintain a locked condition between the input timing reference signal to the PLL module 62, and its output clock signal. In the context of the radio head 26 or base station 18, this means locking the PLL output clock signal to the recovered T1/E1 clock signal from the CRI 24.

Because of the accuracy requirements discussed above, the VCO 74 is generally a TCXO (temperature-compensated crystal oscillator). Temperature compensation usually entails a crystal oscillator within a temperature-controlled enclosure, referred to as an "oven." A TXCO does not achieve the required stability until its oven reaches the desired operating point and stabilizes. STARTUP accommodates this by deferring operation until sufficient time for the VCO 74 to warm-up passes. Warm-up requirements may be altered or eliminated depending upon the oscillator 74 used in the PLL module 62.

After STARTUP, the PLL module 62 enters the INITIAL state, which operates as the beginning state, as well as a default, "catch-all" state when the PLL module 62 is unable to maintain the LOCKED state. The INITIAL state adapts the loop filter 68 such that it applies relatively heavy filtering to the PD values. A filter time constant of 5000 seconds represents an exemplary "slow" configuration of the loop filter 68.

Each time the PLL module 62 enters the INITIAL state operation may transition to the either the LOCKED or COARSE states depending upon the behavior of the control values output from the loop filter 68. The control values output by the loop filter 68 may be stable, with little deviation over time, or may exhibit various deviations over time. For example, the control values may slowly wander back and forth but remain essentially centered about some mean value, or they may exhibit a trending variation. If the control values deviate by some reasonable magnitude back and forth about a mean value, or if they are essentially stable, the PLL module 62 moves to the LOCKED state, otherwise the PLL module 62 moves to the COARSE state in an attempt to get the loop filter 68 adapted more quickly.

The COARSE state applies relatively light filtering as compared to the INITIAL state. An exemplary filter time constant of 150 seconds, as compared to the INITIAL state's 5000 second value, illustrates how "fast" the loop filter 68 is in the COARSE state. With this fast loop filter 68, the COARSE state can make relatively large changes in the control value, as opposed to the very small, incremental changes made by the INITIAL state. This allows the PLL module 62 to move its output clock more quickly into synchronization with the input T1/E1 clock.

The COARSE state has operating time limits imposed on it to prevent the PLL module 62 from "hanging" indefinitely in the COARSE state. Remaining in the COARSE state is less desirable than defaulting to the INITIAL state, as the relatively heaver filtering in the INITIAL state insures that the PLL output frequency is stable, even when the PLL module 62 does not achieve a locked condition. Thus, either after successfully moving the average control value towards its final value (e.g., its locked value), or exceeding the allowable time, the PLL module 62 transitions back to the INITIAL STATE. The COARSE state runs only once per transition into the INITIAL state.

The INITIAL state applies several different processing techniques to the control value averages to determine when to move into the LOCKED state. Nominally, the PLL module 62 operates chiefly in the LOCKED state. Like the INITIAL state, the LOCKED state adapts the loop filter 68 such that it applies relatively heavy filtering to the PD signal. The LOCKED state processes the control value averages to determine when or if the PLL module 62 moves out of the LOCKED condition. The LOCKED state also provides a "self-calibration function" by storing in non-volatile memory a reference control value for initial use in the next operating cycle. This reference control value is determined while the PLL module 62 remains in the LOCKED state for a defined duration of time. If the control value averages begin deviating an amount sufficient to move the PLL module 62 out of the LOCKED state, the PLL module 62 transitions to the UNLOCKED FINE state.

The UNLOCKED FINE state adapts the loop filter 68 such that it applies relatively moderate filtering to the PD signal, as compared to that of the INITIAL or LOCKED states. An exemplary filter time constant for the loop filter 68 in the UNLOCKED FINE state is 4,500 seconds. Once the average control values settle in the UNLOCKED FINE state, the PLL module 62 returns to the INITIAL state, where, if the average control values remain relatively consistent for a defined duration of time, the PLL module 62 transitions to the LOCKED state again. The particular criteria used within each state and in transitioning between states are discussed in more detail below.

State processing and, in turn, deciding when and how to change the loop filter 68, depends upon the behavior of the control values output by the loop filter 68. Ideally, the loop filter 68 repeatedly outputs an unchanging control value perfectly corresponding to the nominal output frequency of the PLL module 62. In practice, the control values exhibit some sample-to-sample variation arising from input clock deviations, although the degree to which the control values vary is greatly reduced as compared to the input clock by operation of the loop filter 68.

In general PLL module state operations are driven by one or more basic values. For state processing, the control values are averaged to form average control values, denoted as $CV_{AVG}$. An exemplary averaging scheme uses the 120 most recent control values to form an average control value $CV_{AVG}$. At four control values per second (4 Hz), a new $CV_{AVG}$ is available every 30 seconds. This averaging period may serve as a timing reference or measurement period for other operations involving the processing of $CV_{AVG}$ in state control operations. As will be explained, several values are derived from the $CV_{AVG}$ values. These values include a $CV_{AVG}$ delta value, determined as the difference between successive $CV_{AVG}$ values and denoted as $CV_{\Delta AVG}$.

Figure 7:
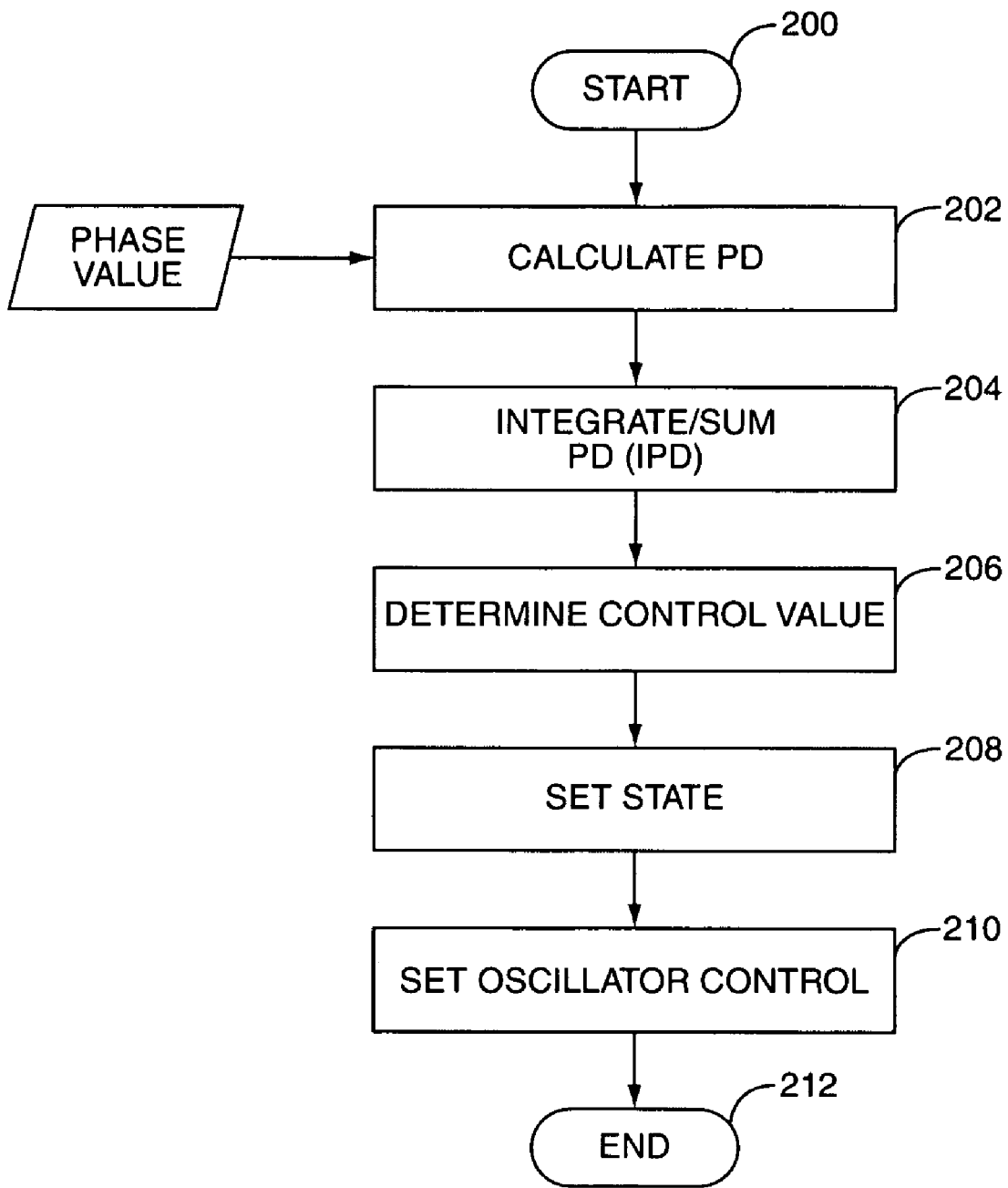
FIG. 7 is a PLL outer control loop logic flow diagram.

FIG. 7 is a flow diagram of the overall PLL module operation represented as an outer control loop. Processing begins (block 200) with the PLL module 62 calculating the phase difference (PD) (block 202) and the integral of the phase difference (IPD) (block 204). These values are provided to the loop filter 68 (e.g., P-I filter), which outputs the control value CV (block 206). Based on the processing the control values as discussed above, the control logic 70 sets/maintains the operating state of the PLL module 62 (block 208), and sets the oscillator control 72 (e.g., DAC) using the control value (block 210), and then processing ends (block 212).

Figure 8A:
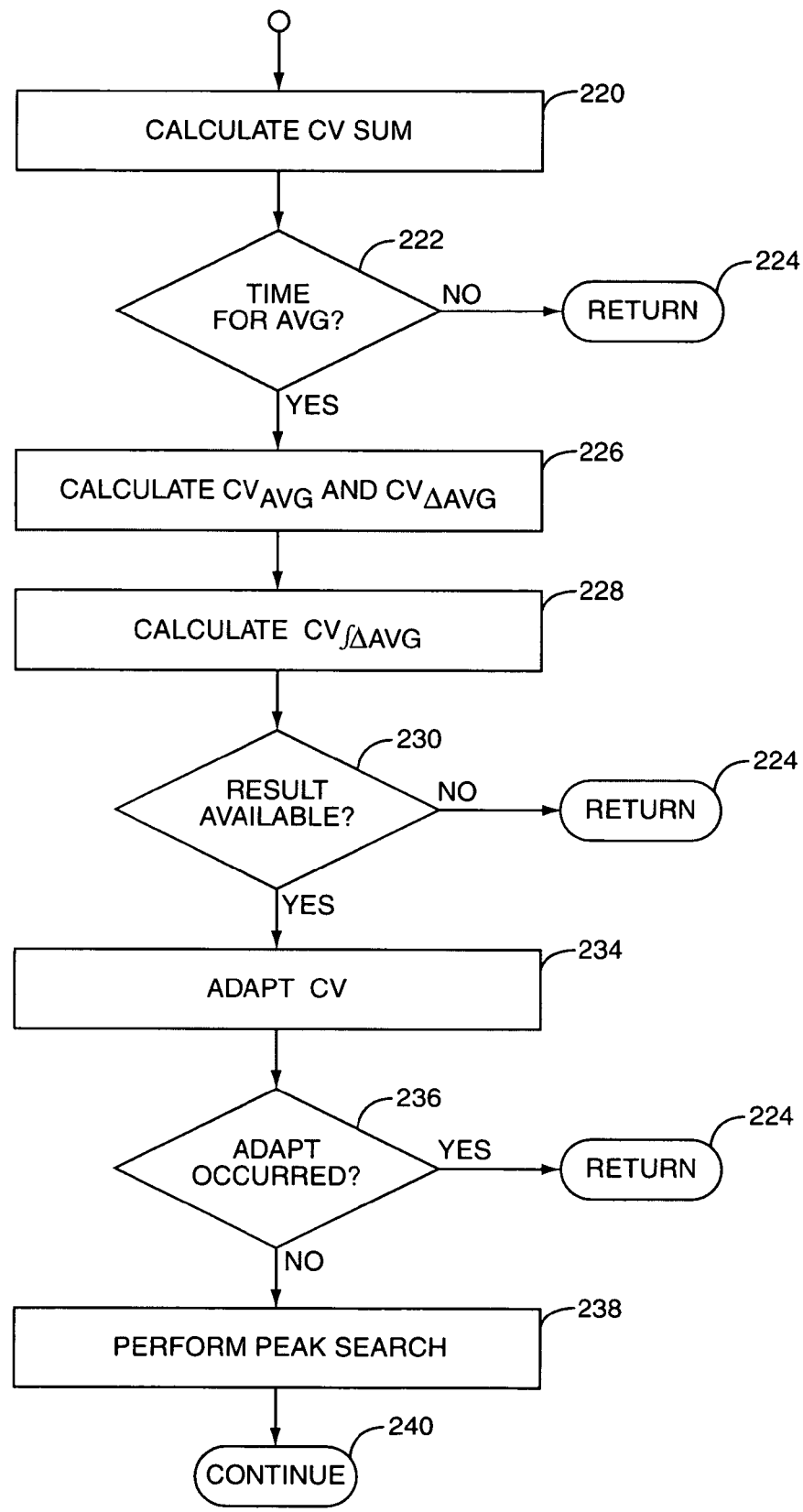
FIG. 8 is a PLL INITIAL state logic flow diagram.
Figure 8B:
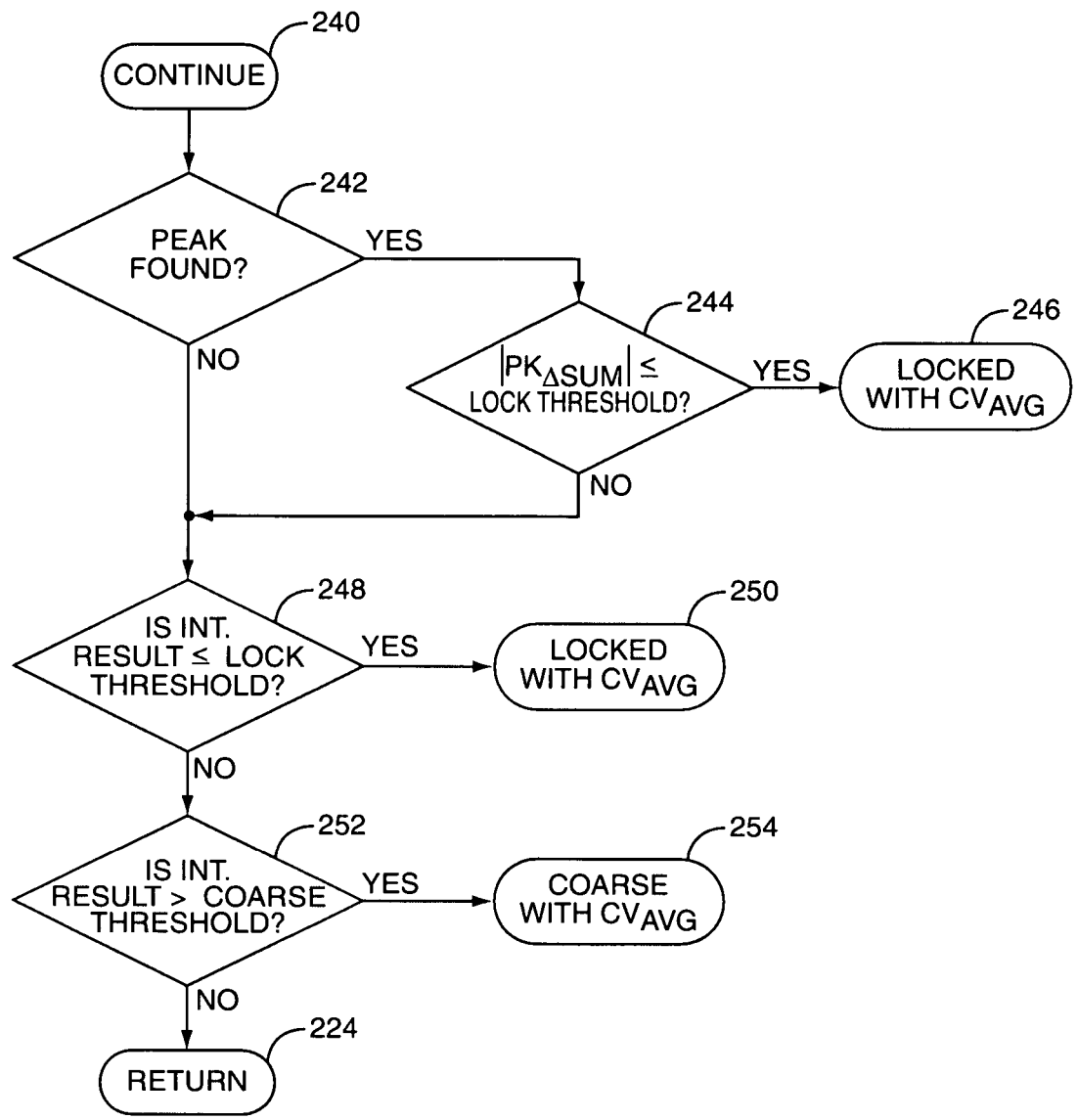

FIG. 8 details processing in the INITIAL state. State processing begins (block 220) with the control logic 70 accumulating successive control values output from the loop filter 68 to form a $CV_{SUM}$ value (block 220). If a sufficient number of control values have not accumulated (block 222), processing returns to the INITIAL state. If there are sufficient control values to calculate an average (block 222), the control logic 70 computes a new (current) control value average, $CV_{AVG}$ (block 226). The control logic 70 then computes the delta between successive $CV_{AVG}$ values as $CV_{AVG}$ (previous)– $CV_{AVG}$(current)=$CV_{\Delta AVG}$ (current) (block 226). The control logic then computes the integral of $CV_{\Delta AVG}$, which may be approximated by summing successive $CV_{\Delta AVG}$ values. The integrated $CV_{\Delta AVG}$ value is denoted as $CV_{\int \Delta AVG}$ (block 228).

To compute $CV_{\int \Delta AVG}$ the control logic 70 must accumulate a sufficient number of $CV_{\Delta AVG}$ samples. Accumulating a sufficient number of samples takes time as, in the exemplary case, a new $CV_{\Delta AVG}$ value is available once every 30 seconds. If a sufficient number of $CV_{\Delta AVG}$ values are not available for computing $CV_{\int \Delta AVG}$ (block 230), processing returns to the INITIAL state (block 224). However, if $CV_{\int \Delta AVG}$ results are available, the control logic 70 runs or continues running a control value adaptation process (block 234). The control value adaptation process attempts to predict a mean value of the control value corresponding to the LOCKED state, thereby improving the response of the PLL module 62. While the adaptation process is more fully explained later, it should be noted here that it may take several minutes to run. If the adaptation process has occurred (block 236), processing returns to the INITIAL state (block 224).

If the adaptation process has not run to completion (block 236), the control logic performs peak processing (block 238). Ideally, the magnitudes of the $CV_{\Delta AVG}$ values are relatively small, because the difference between one $CV_{AVG}$ value and the next should be small. The integral of the $CV_{\Delta AVG}$ values, $CV_{\int \Delta AVG}$, may be used to verify that the variations from one $CV_{\Delta AVG}$ to the next are small. However, certain conditions in the input clock signal can produce $CV_{\Delta AVG}$ that exceed normal expectations, but still correspond to stable input clock conditions. One such instance is where the input clock signal has relatively high amplitude, but low frequency wander about a stable mean clock frequency. In this instance, the $CV_{\int \Delta AVG}$ might exceed normal error checking thresholds, yet the input is holding to a stable mean value, albeit with some consistent wander characteristic. In these cases, it is possible for the PLL module 62 to achieve a locked condition.

Peak processing allows the PLL module 62 to recognize conditions such as that described above. Thus, peak processing enables the PLL module 62 to transition from the INITIAL state to the LOCK state by recognizing conditions where the input clock signal has a stable mean frequency despite having potentially significant levels of wander. Peak processing operates by looking for sign changes in successive $CV_{\Delta AVG}$ values, and returns a value denoted as $PK_{\Delta SUM}$ formed by summing a number of difference values computed for a defined number of successive peaks.

Processing continues (block 240), with the control logic 70 determining whether the $PK_{\Delta SUM}$ value is indicative of a stable mean input clock signal (block 242). This is accomplished by comparing the $PK_{\Delta SUM}$ with a defined threshold for assessing whether or not the PLL module 62 is locked. For example, in the 12-bit DAC example, the control values are DAC count values. A count of 1700 might represent a reasonable control value. Thus, if the control values output by the loop filter 68 varied more or less evenly above and below the nominal value of 1700, peak processing would return a relatively low value for the $PK_{\Delta SUM}$. This results because the excursions above 1700 are essentially offset by the excursions below 1700. Thus, if the "peak trend" based on the absolute value of the $PK_{\Delta SUM}$ values is below, say, a threshold value of 10 in the 12-bit DAC example, the PLL module 62 jumps to the LOCKED state (block 246). Note that the loop filter coefficients $K_p$ and $K_I$ are changed as appropriate upon transitioning to the LOCKED state, and the integrated phase difference value IPD is scaled accordingly with the new $K_i$ and $K_p$ filter coefficients. For example, the new IPD value is calculated as $(CV-K_p*PD)/K_I$.

If the $PK_{\Delta SUM}$ does not warrant changing to the LOCKED state (block 244), the control logic 70 assesses whether the integration value $CV_{\int \Delta AVG}$ is below a defined locked threshold (block 248). The values used for the locked threshold may be empirically determined for given design requirements and a given implementation of the PLL module 62. Because the integration value $CV_{\int \Delta AVG}$ represents the integration of the $CV_{\Delta AVG}$ values over one or more measurement periods, different locked threshold comparison values may be used depending upon how long the integration has run. In the 12-bit DAC example, the maximum error of 0.08% translates into a maximum tolerable DAC count error of ±13 counts. Thus, typical comparison values for the integration value $CV_{\int \Delta AVG}$ might be 3, 5, 7, or more counts, up to some maximum threshold value. Again, the particular count value used as the lock threshold value depends upon how long the integration process has run.

If the integration result $CV_{\int \Delta AVG}$ is at or below the appropriate lock threshold (block 248), the PLL module 62 transitions to the LOCKED state (block 250). Otherwise, the control logic 70 checks whether the integration result $CV_{\int \Delta AVG}$ is above a coarse threshold value. An appropriate coarse threshold may be empirically determined for the PLL module 62, and/or may be determined in relation to the lock thresholds discussed above. If the coarse threshold is exceeded (block 252), the PLL module 62 transitions to the COARSE state (block 254). Otherwise, processing returns to the outer control loop (see FIG. 7) or to other supporting functions.

Figure 9:
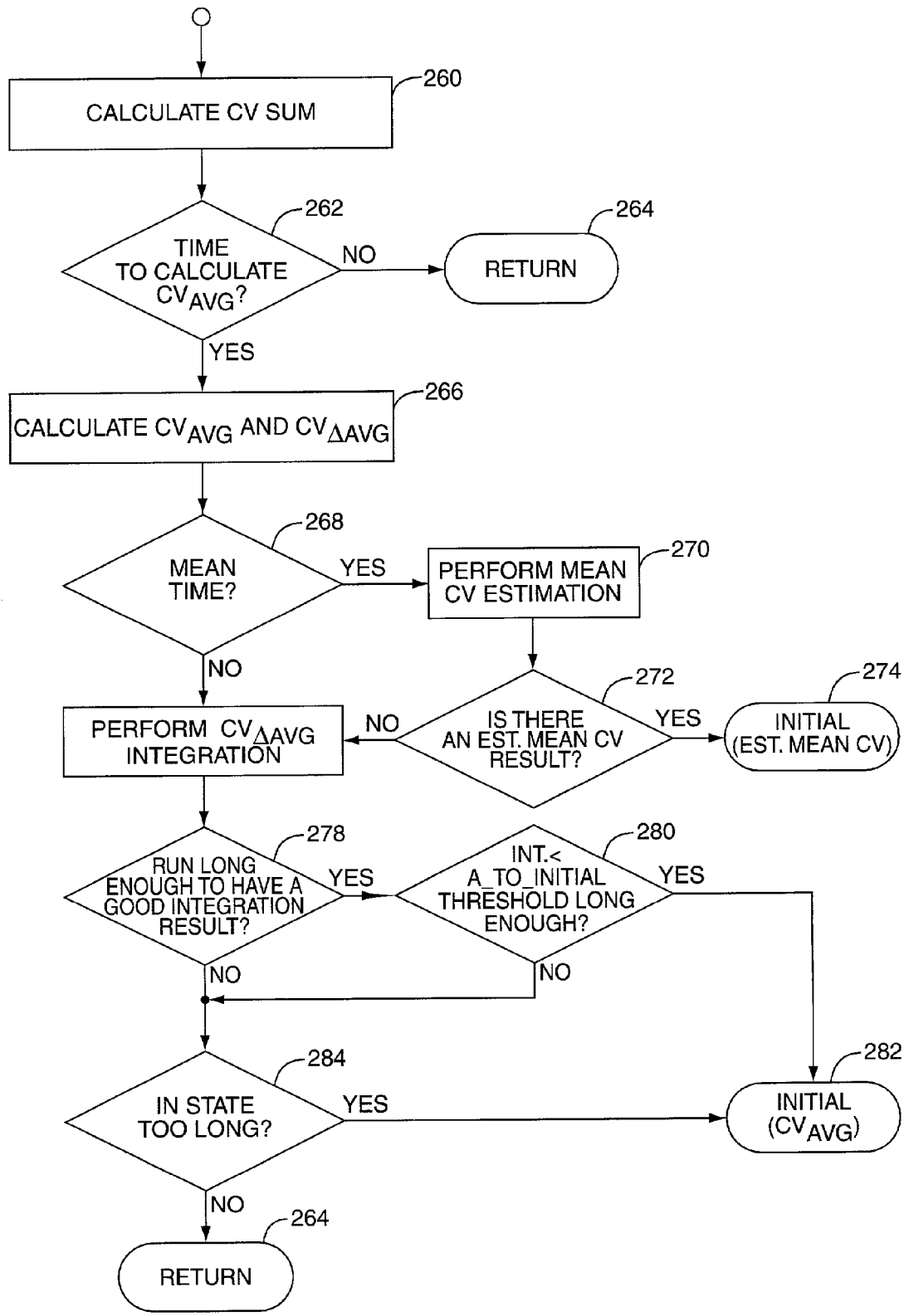
FIG. 9 is a PLL COARSE state logic flow diagram.

FIG. 9 details operation of the PLL module 62 in the COARSE state. As with the other states, COARSE state processing relies on having sufficient control values accumulated for $CV_{AVG}$ value processing. Thus, processing begins with calculation of the $CV_{SUM}$ (block 260), and a determination if its time for calculation of the $CV_{AVG}$ value (block 262). If not, processing returns to the control loop (block 264). Otherwise, the control logic computes values for $CV_{AVG}$ and $CV_{\Delta AVG}$ (block 266), and then determines whether the COARSE state has run long enough to estimate a mean control value (block 268). Mean estimation, as will be explained later, calculates an estimate of the ideal control value (CV) by averaging or taking the mean of the control values that fall between the positive and negative peaks in the stream of control values output by the loop filter 68. Mean estimation works well with the relatively fast filter settings for the loop filter 68 in the COARSE state, because of the many $CV_{\Delta AVG}$ sign changes attendant with running a fast loop filter 68.

If sufficient time has elapsed to begin mean estimation in the COARSE state, the mean estimation process is initiated (block 270). If the mean estimation process returns an estimated mean control value (block 272), processing jumps to the INITIAL state using the estimated mean control value (block 274). Note, that the loop filter coefficients are updated upon jumping to the INITIAL state, to implement that state's relatively heavy loop filtering. Thus, the COARSE state provides an opportunity through mean estimation to quickly move the control value to something very close to its final, stabilized value, and then jump back to the INITIAL state, where the control value changes much more slowly and by smaller amounts to a final, stable value.

If mean estimation does not return an estimated mean control value (block 272), processing continues with attempting to determine an integration result $CV_{\int \Delta AVG}$ for the control value average deltas $CV_{\Delta AVG}$ (block 276). If the COARSE state has run long enough to develop an adequate number of $CV_{\Delta AVG}$ for meaningful integration (block 278), the integration result is compared to an initial control value threshold (block 280). As with the other control value comparison thresholds (e.g., locked threshold), the initial threshold may be empirically determined for a given PLL module implementation, and can be set such that the transition to and from the INITIAL state to the COARSE state has some amount of transition hysteresis. If the integration result is below the initial threshold, processing jumps to the INITIAL state (block 282) and the loop filter 68 is adjusted appropriately. Otherwise, processing checks to see if the COARSE state has run its maximum allowable time (block 284). If so, processing jumps to the INITIAL state (block 282). If not, the COARSE state returns to the outer control loop (block 264) without transitioning states.

Figure 10:
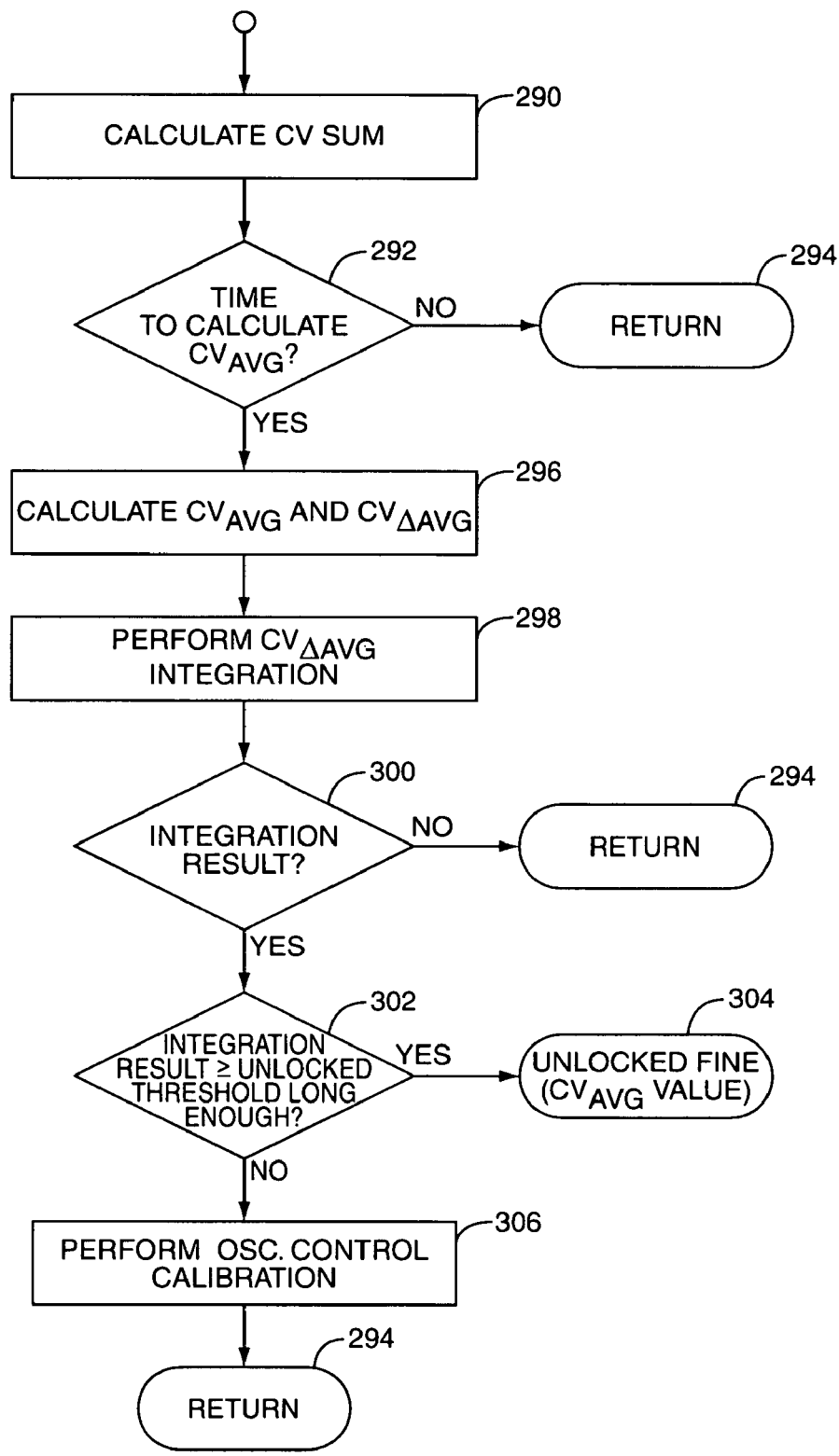
FIG. 10 is a PLL LOCKED state logic flow diagram.

FIG. 10 depicts logic for the PLL LOCKED state. The PLL LOCKED state adjusts the loop filter 68 for relatively heavy filtering, and is accessible from the INITIAL state. The PLL LOCKED state can transition only to the UNLOCKED FINE state. Unlike the other operating states, the PLL LOCKED state determines a "calibrated" control value.

Processing begins with calculation of the control value sum (block 290). If enough control values have been accumulated (block 292), a new average control value $CV_{AVG}$ and new delta control value average $CV_{\Delta AVG}$ are calculated (block 296). If not, processing returns to the outer control loop (block 294). Processing continues with running integration processing of the delta control value averages $CV_{\Delta AVG}$ (block 298). If a delta average integration result $CV_{\int \Delta AVG}$ is available (block 300), processing continues with comparing the integration result to a threshold representing an unlocked control value condition (block 302). If the $CV_{\int \Delta AVG}$ value is equal to or exceeds the unlocked threshold, processing jumps to the UNLOCKED FINE state (block 304). If the $CV_{\int \Delta AVG}$ value is less than the unlocked threshold, processing continues with optional control value calibration (block 306), and then returns to the outer control loop (block 294).

Control value calibration processing (block 306) maintains a long-term control value average. After the PLL module 62 remains locked for an extended period, two hours for example, calibration processing stores a long-term average in nonvolatile memory for use as an initial value in the next operating cycle of the PLL module 62. If the PLL module 62 remains in the LOCKED state for long periods of time, several days for example, calibration processing can update the long-term average value stored in nonvolatile memory at a reduced rate, once per day for example.

Figure 11:
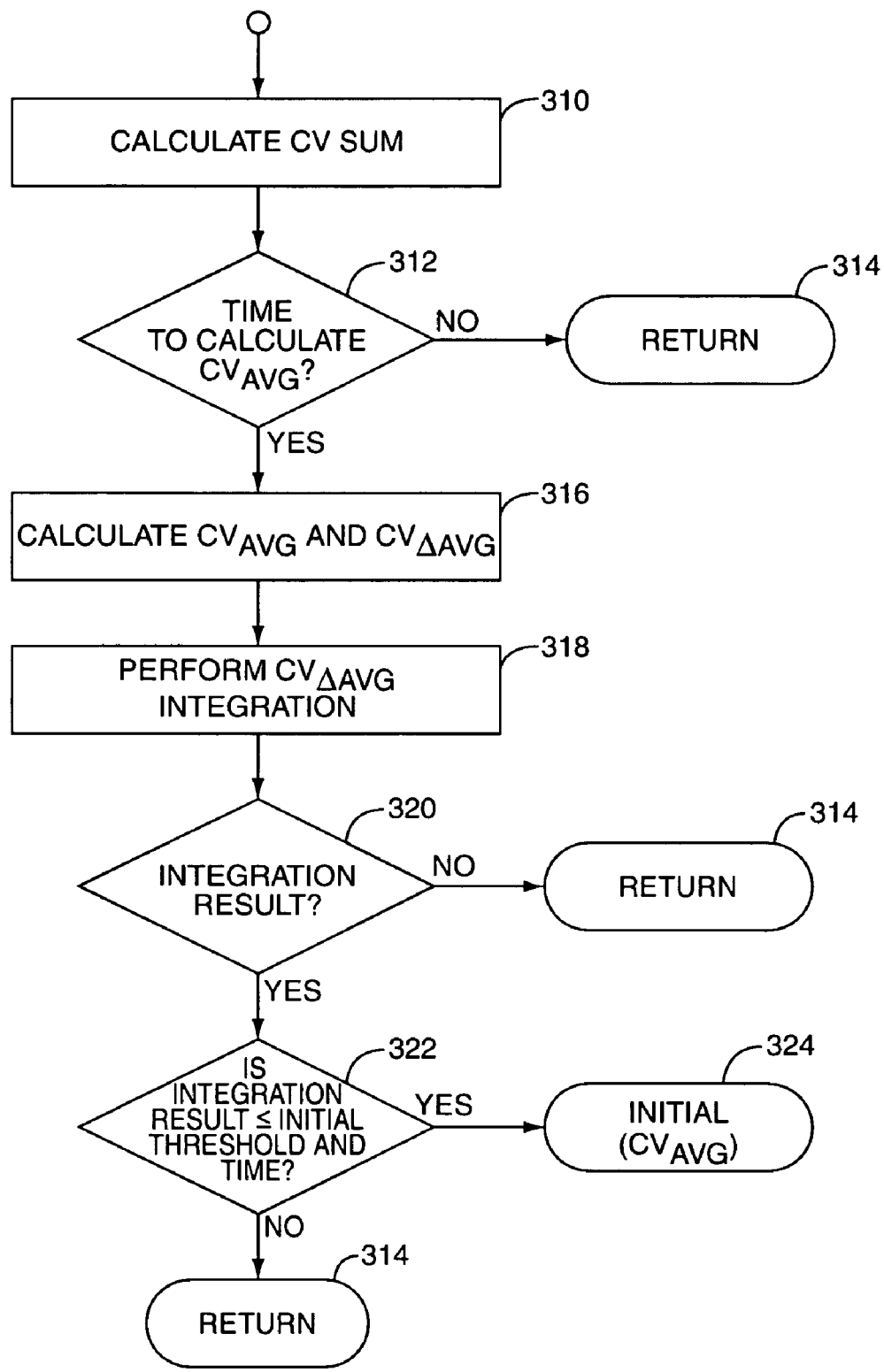
FIG. 11 is a PLL UNLOCKED FINE state logic flow diagram.

FIG. 11 illustrates operation in the PLL UNLOCKED FINE state. As noted, this state is transitioned to only from the LOCKED state, and transitions only to the INITIAL state. Processing begins with accumulating control values (block 310). If enough control values are accumulated to compute a new average control value $CV_{AVG}$ (block 312), processing continues with the calculation of a new control value average $CV_{AVG}$ and a new delta average control value $CV_{\Delta AVG}$ (block 316). If there are not enough control values accumulated, processing returns to the outer control loop (block 314).

Processing continues with running integration processing of the delta control value averages $CV_{\Delta AVG}$ (block 318). If a delta average integration result $CV_{\int \Delta AVG}$ is available (block 320), processing continues with comparing the integration result to a threshold representing an INITIAL state threshold (block 322). If the $CV_{\int \Delta AVG}$ value is equal to or less than the INITIAL state threshold, processing transitions to the INITIAL state (block 324). If the $CV_{\int \Delta AVG}$ value is greater than the INITIAL state threshold, there is no state transition, and processing returns to the outer control loop (block 314).

Figure 12:
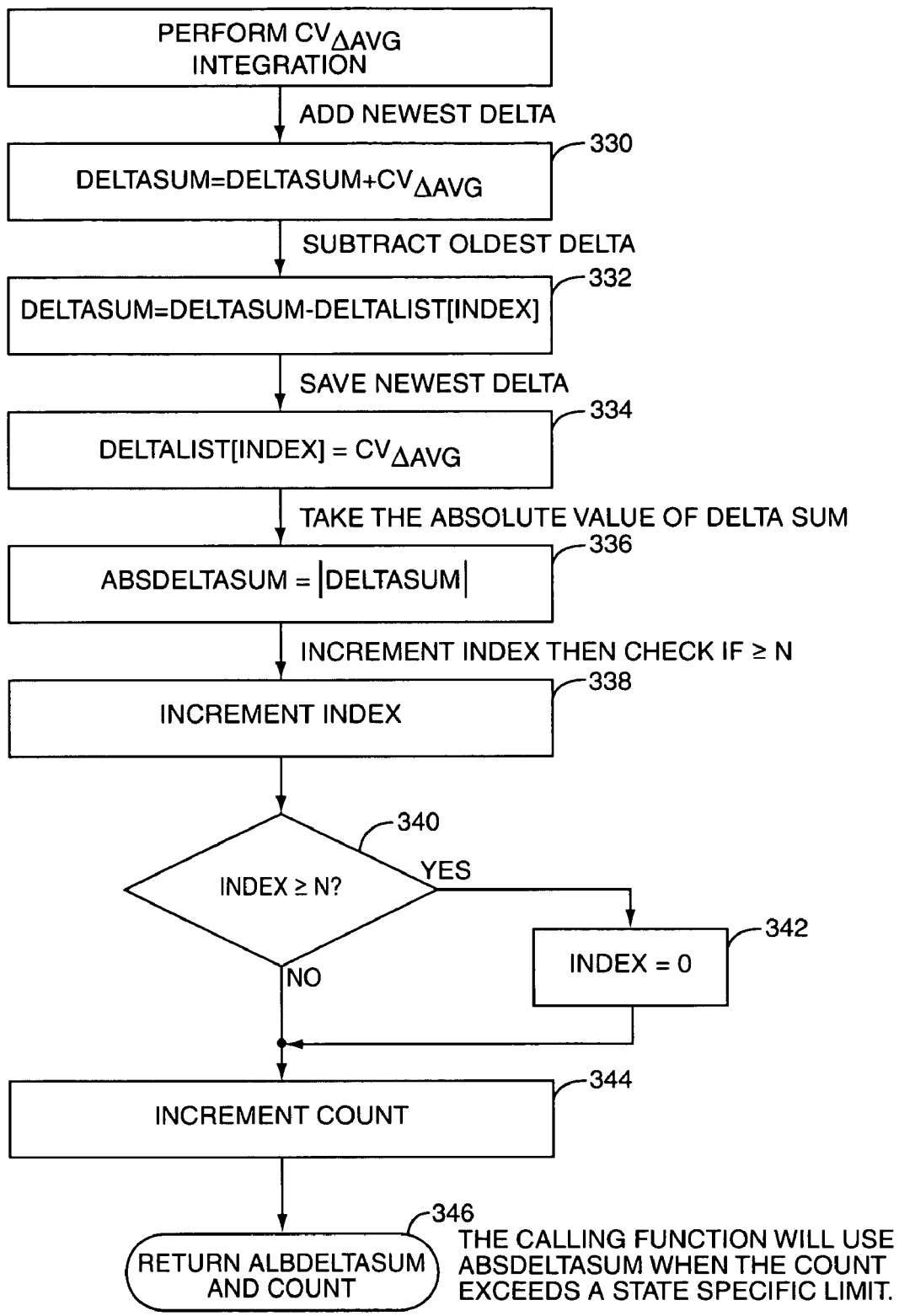
FIG. 12 is a PLL control value integration process logic flow diagram.

FIG. 12 details one implementation of the $CV_{\Delta AVG}$ integration process utilized in several preceding logical flow diagrams. This processing technique maintains a list of the last N $CV_{\Delta AVG}$ values. The values in the list are summed to create a short duration integrated $CV_{AVG}$ value. This result provides information about the trend of the phase difference (PD) signal. Processing begins with a variable labeled deltaSum being updated with the newest $CV_{\Delta AVG}$ value (block 330). The oldest $CV_{\Delta AVG}$ value maintained in the list is then subtracted from deltaSum (block 332). The newest $CV_{\Delta AVG}$ value is then saved in the list of previous $CV_{\Delta AVG}$ values (block 334). Processing then determines the absolute value of delta-Sum (block 336), and increments an index pointer used to maintain the running list of previous $CV_{\Delta AVG}$ values (block 338).

If the index counter is =N (block 340) the index counter is reset to 0 (block 342). In either case the index counter is then incremented (block 344) and the operation returns the absolute value of deltaSum as well as the list count (block 346). The list count allows the logic state (state processing routine) that invoked the integration processing function to determine if an adequate number of list values were available to generate a useable integration result. For example, the decision in FIG. 11 relating to the determination as to whether an integration result is available (block 322, FIG. 11), may be based on determining whether an adequate number of prior $CV_{\Delta AVG}$ values were used to compute $CV_{\int \Delta AVG}$.

Figure 13:
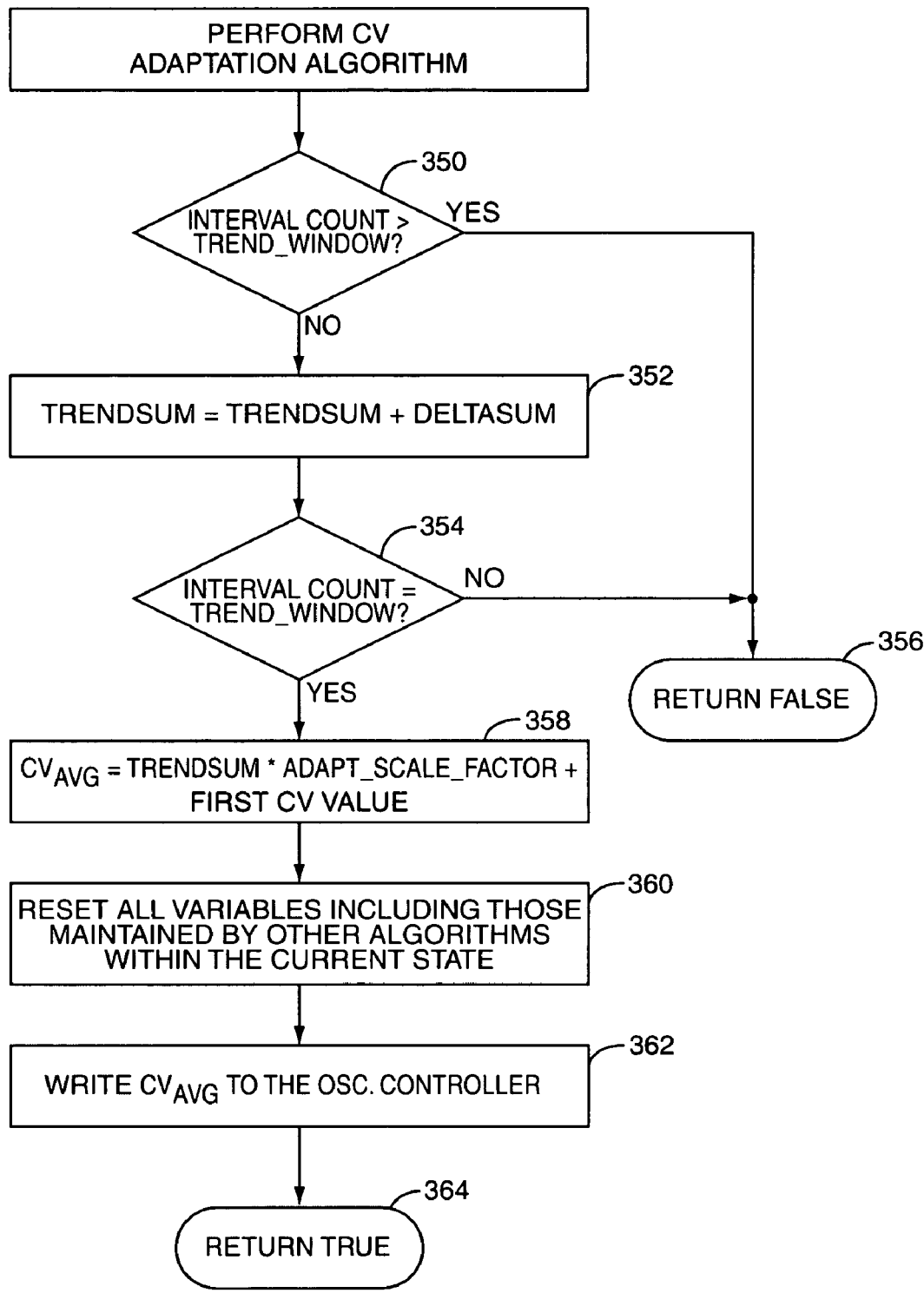
FIG. 13 is a PLL control value adaptation process logic flow diagram.

FIG. 13 illustrates one implementation of the control value adaptation technique used, for example, in the INITIAL state processing (see FIG. 8A, block 234). This process calculates an estimate of the trend in movement of the control value for a fixed time. In essence, the process takes the derivative of the trend to estimate the trend minimum. When the measurement is completed, the calculated trend is compared to a defined threshold. If the threshold is exceeded, the technique estimates the ideal control value by scaling the trend and adding it to the control value active when the process was started. This estimated ideal control value is written to the oscillator control 72. In this way, the process improves the lock time of the PLL module 62 by allowing the state to make an educated guess as to where the control value trend will stabilize.

The processing begins (block 350) with the control logic 70 comparing an interval counter to a defined trend window. The trend window represents a predetermined period of time over which the trend will be developed. If the interval counter has timed an interval exceeding the trend window, the process returns a false condition (block 356), and the interval counter may be reset allowing the process to run again. If the interval counter is less than the allowed trend window, the trend sum value is updated with the newest delta sum value (block 352), which is determined using the latest $CV_{\Delta AVG}$ value. The interval counter is then compared against the trend window (block 354). If the interval count equals the trend window at this point, the $CV_{AVG}$ value is set equal to the trend sum multiplied by a predetermined scale factor plus the initial control value active at the beginning of trend processing (block 358). If the interval counter does not yet equal the trend window (block 354), the process returns a false addition (block 356) meaning that a trend value is not yet available.

The process then resets all variables associated with trend processing, which may include variables used by other processes that are active within the current state (block 360). The trend-calculated $CV_{AVG}$ value is then written to the oscillator controller 72 (block 362), and trend processing ends with the return of a true condition (block 364). The true condition indicates that a trend value was successfully estimated.

Figure 14:
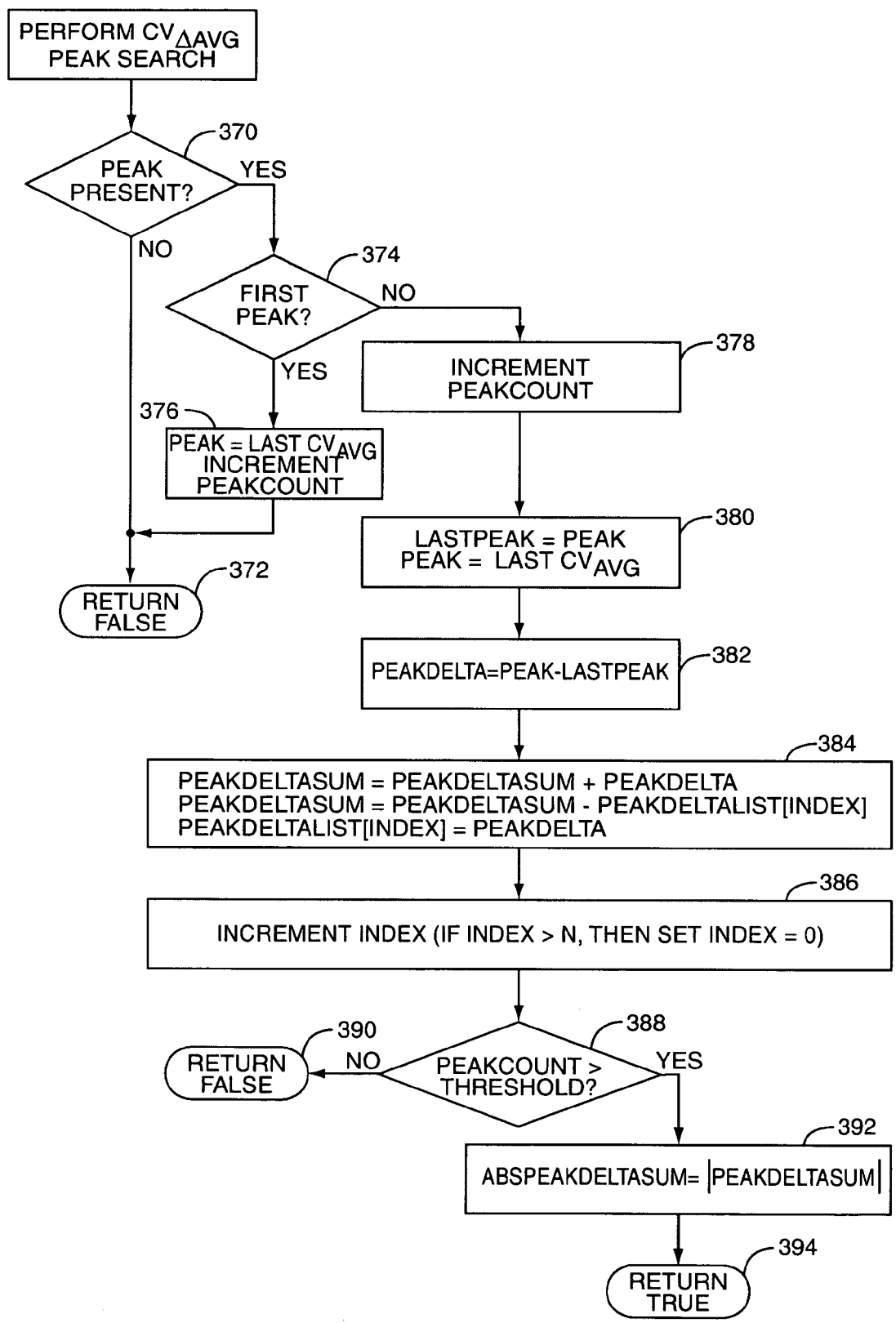
FIG. 14 is a PLL control value peak searching process logic flow diagram.

FIG. 14 illustrates one implementation for a $CV_{\Delta AVG}$ peak searching process. Peak searching is used, for example in the INITIAL state (FIG. 8), to identify conditions where the control value is stable around a mean value, but wander in the T1/E1 clock cause relatively slow deviations about the mean value.

Peak processing searches for peaks or sign changes in the $CV_{\Delta AVG}$ value. When a peak or a positive to negative transition occurs, the difference between this peak and the last peak is calculated. This peak delta shows the trend of drifting control values with medium wander (approximately less than 50 mHz). The process maintains a list of these peak delta values, with the list used to keep a running sum or integration of the peak deltas. When the process has run long enough to produce a "good" result, the absolute value of the peak delta sum $PK_{\Delta SUM}$ is returned to the state processing routine that called the peak processing routine.

Processing begins with determination of whether a peak is present (block 370). If no peak is present, the process returns a false condition to the calling state (block 372). If a peak is available, the process determines whether or not it is a first peak (block 374). If it is the first peak, a peak variable is set equal to the last $CV_{AVG}$ value and a peak count variable is incremented (block 376), and then processing ends with return of a false indicator (block 372).

If the peak is not a first peak, the peak count variable is incremented (block 378) and a last peak variable is set equal to the last $CV_{AVG}$ value (block 380). This operation has the effect of saving the last two peaks. Next, the difference between these two peaks is determined as a peak delta $PK_\Delta$ by subtracting the last peak value from the current peak value (block 382). The next operation updates the $PK_{\Delta SUM}$ variable by calculating a running sum of the peak differences $PK_\Delta$ (block 384) and then a list index is incremented. If incrementing sets the list index past the maximum list count, the index is reset to 0 (block 386). The process then determines if it has run long enough to yield a good sum (block 388), which may amount to determining whether an adequate number of peak differences $PK_\Delta$ have been processed. If the process has not run long enough, it returns a false value to the calling state (block 390). Otherwise, it turns the absolute value of the running sum along with the true indicator indicating that a peak delta sum $PK_{\Delta SUM}$ is available (block 394).

Figure 15:
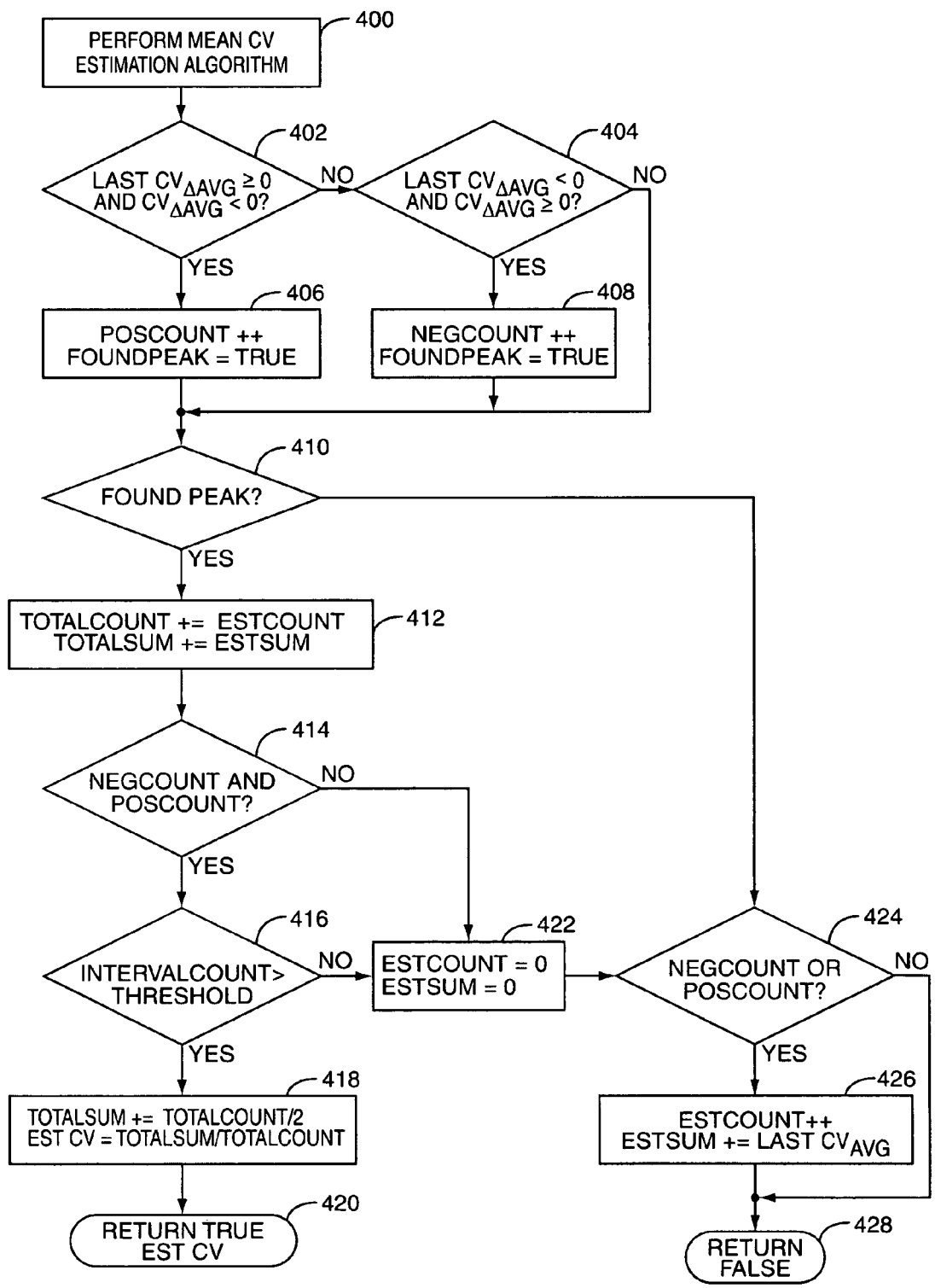
FIG. 15 is a PLL control value mean estimation process logic flow diagram.

FIG. 15 details the process for mean control value estimation. Mean estimation is used, for example, in the COARSE state, to speed up the movement of the control value towards its nominal final value.

Mean estimation involves calculating an estimate of the ideal control value by averaging or taking the mean of the average control values $CV_{AVG}$ that lie between peaks in the running stream of the average control values $CV_{AVG}$. This process works well when the loop filter 68 is adapted for relatively light (fast) filtering, as it is in the COARSE state, where there are significant sign changes in the $CV_{\Delta AVG}$ values.

Processing begins (block 400) by setting a "foundpeak" variable to false. Processing then continues by looking at the current and prior $CV_{AVG}$ values to determine whether there is a positive peak or a negative peak (blocks 402 and 404, respectively). If a positive peak is detected (block 402), a positive peak count variable, posCount, is incremented (block 406). If a negative peak is detected (block 404), a negative peak count variable, negCount, is incremented (block 408). In both cases, the value of foundPeak is set to true, indicating that either a positive or negative peak was found.

If foundPeak is true (block 410), processing continues with updating a total count variable, totalCount, and a total sum variable, totalSum, based on the results from the latest half cycle. In this context, a half-cycle includes the average control values $CV_{AVG}$ between the last two peaks. The totalCount variable is updated based on an estimated count variable, estCount, which is driven by the difference between successive $CV_{AVG}$ values. The totalSum variable is updated based on an estimated sum variable, estSum, which is a running accumulation of $CV_{AVG}$ values over the preceding half cycle.

After updating the above variables, processing continues with a determination as to whether an entire peak cycle has occurred. This may be determined by evaluating the posCount and negCount variables (block 414). If a full cycle has occurred, processing continues with an evaluation of whether peak processing has run long enough to determine a valid estimate for the control value (block 416). This evaluation may be based on determining whether peak processing has run over an appropriate interval. If so, processing continues by updating the totalSum value with the totalCount variable divided by 2, which has the effect of rounding the totalSum variable (block 418). The estimated control value, estCV, is then determined by dividing the totalSum variable by the totalCount variable (block 418). Processing then continues with peak processing returning a true indicator and the estCV value to the calling process.

If the peak processing has not run over an adequate interval (block 416), processing continues with resetting the estCount and estSum variables (block 422). If at least one positive or negative peak has occurred, results from the preceding half cycle are accumulated using the last $CV_{AVG}$ value to update the estSum variable (block 426), with the estCount value also being incremented. Processing then ends with a false value being returned to the calling process (block 428).

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of generating an output clock signal from a phase-locked loop (PLL), the method comprising:
    determining successive phase difference values between a reference clock signal and said output clock signal;
    filtering said successive phase difference values to generate successive control values;
    controlling a frequency of said output clock signal based on said successive control values; and
    adapting a filter used to filter said successive phase difference values based on average control values determined from said successive control values.

2. The method of claim 1 further comprising detecting a trend in said average control values and determining a filter state based on said trend in said average control values.

3. The method of claim 2 further comprising selecting a fast filter setting for said filter when said trend indicates that said average control values have not stabilized.

4. The method of claim 2 further comprising selecting a slow filter setting for said filter when said trend indicates that said average control values have stabilized.

5. The method of claim 1 further comprising determining difference values between successive ones of said average control values, and wherein adapting said filter based on said average control values determined from said successive control values comprises adapting said filter based on processing said difference values.

6. The method of claim 5 wherein adapting said filter based on processing said difference values comprises:
    integrating a number of said difference values to determine an integrated value of said number of said difference values; and
    adapting said filter based on said integrated value.

7. The method of claim 6 wherein adapting said filter based on said integrated value comprises setting said filter to a slow filter state if said integrated value is below a defined threshold.

8. The method of claim 5 wherein adapting said filter based on processing said difference values comprises:
    identifying peak values in said difference values; and
    adapting said filter based on said peak values.

9. The method of claim 8 wherein adapting said filter based on said peak values comprises setting said filter to a slow filter state if a summation of a number of successive peak values is below a defined threshold.

10. A method of controlling a phase-locked loop (PLL) to reduce clock deviations in an output signal generated by the PLL relative to clock deviations in an input reference timing signal to the PLL, the method comprising:
    generating a phase error signal by determining a phase difference between said input reference timing signal and said output signal;
    filtering said phase error signal with a digital filter to produce a digital control value;
    determining average control values by averaging successive ones of said digital control value; and
    adapting a filter characteristic of said digital filter based on said average control values.

11. The method of claim 10 wherein adapting said filter characteristic of said digital filter based on said average control values comprises:
    adapting said digital filter such that relatively heavy filtering is applied to said phase error signal when successive average control values indicate a locked condition of the PLL; and
    adapting said digital filter such that relatively light filtering is applied to said phase error signal when successive average control values indicate an unlocked condition of the PLL.

12. The method of claim 10 wherein said digital filter is a proportional-integral (P-I) digital filter and adapting said filter characteristic of said digital filter based on the average control values comprises changing a value of a proportional digital filter coefficient $K_p$ and an integral digital filter coefficient $K_i$.

13. The method of claim 10 wherein adapting said filter characteristic of said digital filter based on said average control values comprises:
    determining difference values between successive ones of said average control values;
    integrating said difference values to determine an integrated value; and
    adapting said filter characteristic of said digital filter based on said integrated value.

14. The method of claim 13 wherein said adapting said filter characteristic of said digital filter based on said integrated value comprises changing from a relatively slow filter time constant to a relatively fast filter time constant if said integrated value is above a first integrated value threshold.

15. The method of claim 14 further comprising changing back to said relatively slow filter time constant if said integrated value falls below a second integrated value threshold.

16. The method of claim 15 further comprising changing back to said relatively slow filter time constant if said integrated value does not fall below said second integrated value threshold after a defined duration of time.

17. The method of claim 14 further comprising:
    estimating a mean nominal value for said digital control value while PLL is operating with said relatively fast filter time constant; and
    setting said digital control value to said mean nominal value.

18. The method of claim 13 further comprising entering a locked state of operation for said PLL if said integrated value is below a locked state integrated value threshold.

19. The method of claim 18 further comprising storing a long-term control value average for use during a subsequent initialization of said PLL if said integrated value remains below said locked state integrated value threshold for a defined duration.

20. The method of claim 13 further comprising:
    estimating a trend of said digital control values;

calculating an estimated nominal value for said digital control value based on determining an estimated trend minimum; and setting said digital control value to said estimated nominal value.

21. The method of claim 13 further comprising:

identifying peak values in successive ones of said integrated value;

summing a number of peak values to determine a peak summation value; and entering a locked state of operation for said PLL if said integrated value is below a locked state peak value threshold.

22. The method of claim 13 wherein said adapting said filter characteristic of said digital filter based on said integrated value comprises changing from a relatively slow filter time constant to a relatively moderate filter time constant if said integrated value exceeds a locked state integrated value threshold.

23. The method of claim 22 further comprising changing from said relatively moderate filter time constant to said relatively slow filter time constant if said integrated value falls below an unlocked state integrated value threshold.

24. A phase-locked loop comprising:

a controllable oscillator providing an output signal from the PLL at a frequency proportionate to an oscillator control signal;

a phase detector providing a phase error signal by detecting a phase difference between an input signal and said output signal;

an adjustable loop filter providing control values based on filtering said phase error signal;

a control circuit providing the oscillator control signal responsive to said control values; and control logic to control a filter characteristic of said loop filter based on an average control value determined from successive ones of said control values to minimize clock deviations in said output signal.

25. The phase-locked loop of claim 24 wherein said control logic is operable in one of a defined number of states, and further wherein said control logic adjusts said filter characteristic of said loop filter based on a current state of said control logic.

26. The phase-locked loop of claim 25 wherein said control logic transitions from a first state to a second state based on at least one characteristic of said average control values.

27. The phase-locked loop of claim 26 wherein said control logic adjusts said filter characteristic of said loop filter based on a difference between successive average control values.

28. The phase-locked loop of claim 27 wherein said control logic further adjusts said filter characteristic of said loop filter based on a trend in said difference between successive average control values.

29. The phase-locked loop of claim 27 wherein said control logic further adjusts said filter characteristic of said loop filter based on an integration of said average control values.

30. The phase-locked loop of claim 24 wherein said phase detector comprises:

a first counter driven by clock transitions in said input signal and configured to generate a count overflow signal upon reaching a defined count;

a second counter driven by clock transitions in said output signal and configured to output a current count value;

a count register configured to capture said current count value of said second counter in response to said count overflow signal; and processing logic adapted to determine said phase error signal based on differences in successive current count values.

31. The phase-locked loop of claim 30 wherein said processing logic comprises a portion of said control logic.

32. The phase-locked loop of claim 24 wherein said loop filter comprises a digital loop filter adapted to output said control value in a digital format.

33. The phase-locked loop of claim 32 wherein said digital loop filter is a proportional-integral (P-I) filter, and further wherein said control logic is adapted to update a proportional coefficient and an integral coefficient to effect changes in said at least one filter characteristic.

34. The phase-locked loop of claim 24 wherein said control circuit is a digital-to-analog converter (DAC), and further wherein said control value provided by said loop filter is a digital value conforming to an input range of said DAC such that said DAC generates a control voltage as said oscillator control signal relative to said digital value.

35. The phase-locked loop of claim 34 wherein said controllable oscillator is a voltage-controlled oscillator (VCO), and further wherein said VCO generates said output signal at a frequency determined by a value of said control voltage generated by said DAC.

36. The phase-locked loop of claim 34 wherein said control logic determines a DAC initial value based on said average control values and stores said DAC initial value in associated memory for loading into said DAC upon a subsequent initialization of said PLL.

37. The phase-locked loop of claim 24 wherein said control operates in one of a defined number of states, with each of said states corresponding to a desired filter setting for said loop filter, and to control transitions between said states based on processing average control values determined from said control values.

38. The phase-locked loop of claim 37 wherein said control logic controls said transitions between said states based on difference values determined from successive ones of said average control values.

39. The phase-locked loop of claim 24 wherein said control logic comprises a digital processor.

* * * * *